United States Patent

Nakagawa et al.

[11] Patent Number: 6,030,667
[45] Date of Patent: Feb. 29, 2000

[54] APPARATUS AND METHOD FOR APPLYING RF POWER APPARATUS AND METHOD FOR GENERATING PLASMA AND APPARATUS AND METHOD FOR PROCESSING WITH PLASMA

[75] Inventors: Hideo Nakagawa, Kanagawa; Shigenori Hayashi, Nara; Ichiro Nakayama; Tomohiro Okumura, both of Osaka, all of Japan

[73] Assignee: Matsushita Electric Industrial Co., Ltd., Osaka, Japan

[21] Appl. No.: 08/996,705

[22] Filed: Dec. 24, 1997

Related U.S. Application Data

[62] Division of application No. 08/807,853, Feb. 26, 1997, abandoned.

[30] Foreign Application Priority Data

Feb. 27, 1997 [JP] Japan ................................. 8-039436

[51] Int. Cl.[7] .............................. H05H 1/24; H03H 7/38; C23C 16/00
[52] U.S. Cl. ................. 427/569; 118/723 I; 118/723 IR; 438/758; 438/689; 333/33
[58] Field of Search .......................... 427/569; 118/723 I, 118/723 AN, 723 ME, 723 IR; 333/32, 33, 34, 35; 438/758, 689

[56] References Cited

U.S. PATENT DOCUMENTS

| | | |
|---|---|---|
| 4,527,550 | 7/1985 | Ruggera et al. . |
| 4,568,563 | 2/1986 | Jackson et al. ........................ 427/569 |
| 4,746,538 | 5/1988 | Mackowski .............................. 427/577 |
| 4,755,756 | 7/1988 | Nishihara et al. . |
| 4,797,617 | 1/1989 | Misic et al. . |
| 4,824,690 | 4/1989 | Heinecke et al. ....................... 427/577 |
| 4,948,458 | 8/1990 | Ogle . |
| 5,180,949 | 1/1993 | Durr . |
| 5,243,289 | 9/1993 | Blum et al. . |
| 5,296,272 | 3/1994 | Matossian et al. ..................... 427/571 |
| 5,458,927 | 10/1995 | Malaczynski et al. ................. 427/577 |
| 5,549,795 | 8/1996 | Gregoire et al. . |
| 5,571,366 | 11/1996 | Ishii et al. ............................. 118/723 I |
| 5,578,165 | 11/1996 | Patrick et al. . |
| 5,594,456 | 1/1997 | Norris et al. ............................ 343/701 |

FOREIGN PATENT DOCUMENTS 4-230999  9/1992  Japan .

*Primary Examiner*—Marianne Padgett
*Attorney, Agent, or Firm*—McDermott, Will & Emery

[57] ABSTRACT

On the bottom of a chamber, there is provided a lower electrode for supporting an object to be processed with intervention of an insulator. A first RF power source applies RF power to a multiple spiral coil composed of four spiral coil elements connected in parallel via an impedance matcher. The length of each of the coil elements corresponds to ¼ of the wavelength of the RF power supplied from the first RF power source. A second RF power source applies an RF bias voltage to the lower electrode.

6 Claims, 20 Drawing Sheets

LENGTH OF EACH COIL ELEMENT IS APPROXIMATELY AN INTEGRAL MULTIPLE OF 1/4 OF THE WAVELENGTH OF THE FREQUENCY OF RF POWER

LENGTH OF EACH COIL ELEMENT IS APPROXIMATELY AN INTEGRAL MULTIPLE OF 1/4 OF THE WAVELENGTH OF THE FREQUENCY OF RF POWER

APPARATUS AND METHOD FOR APPLYING RF POWER APPARATUS AND METHOD FOR GENERATING PLASMA AND APPARATUS AND METHOD FOR PROCESSING WITH PLASMA

This is a Divisional of U.S. patent application Ser. No. 08/807,853, filed Feb. 26, 1997 now abandoned.

BACKGROUND OF THE INVENTION

The present invention relates to plasma processing technology for performing such processing as micro-fabrication by dry etching, thin-film formation, and surface modification by utilizing plasma, to plasma generating technology for use in the plasma processing, and to RF-power applying technology for generating plasma.

In recent years, plasma processing technology has found a wide range of applications such as micro-fabrication by dry etching, thin-film formation, surface treatment such as surface modification for treating the surface of a material. The plasma processing technology is particularly useful in the field of semiconductor, since it is essential to the manufacture of ultralarge-scale integrated circuits.

Conventionally, an inductively-coupled parallel-plate plasma generating apparatus has been used widely for plasma processing. This is because the foregoing apparatus is capable of easily generating a uniform, low-density plasma under comparatively low pressure, which satisfies the demand for equal plasma processing. However, the recent tendency toward increasingly miniaturized semiconductor integrated circuits has necessitated the generation of a high-density plasma under extremely low pressure. As a result, attention is being given to an inductively-coupled plasma generating apparatus which generates a plasma by applying an induction field formed with an RF current flowing through a coil to a space under reduced pressure as well as a plasma processing apparatus using the inductively-coupled apparatus for generating plasma.

By way of example, conventional inductively-coupled plasma processing apparatus will be described with reference to the drawings.

FIG. 18 is a schematic view of an inductively-coupled plasma processing apparatus according to a first conventional embodiment. In the drawing is shown a cylindrical chamber 101 having its inside held under a specified pressure. The chamber 101 is provided with gas introducing means, exhaust means, and carrying means for carrying an object to be processed in and out of the chamber 101, each of which is not shown.

On the bottom of the chamber 101, there is provided a lower electrode (sample stage) 103 with intervention of an insulator 102. The lower electrode 103 supports the object 104 to be processed such as a semiconductor wafer, which is subjected to etching or film deposition.

Above the chamber 101, there are provided a first RF (Radio-Frequency) power source 105 and a single flat, spiral coil 106 having one terminal grounded. The first RF power source 105 is connected to the other terminal of the spiral coil 106 via an impedance matcher 107. Below the chamber 101, there is provided a second RF power source 108. The second RF power source 108 is electrically insulated from the chamber 101 and the insulator 102, while it is electrically connected to the lower electrode 103. The second RF power source 108 applies an RF bias voltage to a plasma generated in the chamber 101. For safety, the ground potential of each of the first and second RF power sources 105 and 108 and the ground potential of the spiral coil 106 are adjusted to be equal to the ground potential of the chamber 101.

A description will be given below to a method of performing plasma processing by using the intuitively-coupled plasma processing apparatus according to the first conventional embodiment.

Initially, the object 104 to be processed is carried in the chamber 101 by the carrying means (not shown). Thereafter, gas is introduced into the chamber 101 by the gas introducing means (not shown) and exhausted from the chamber 101 by the exhaust means (not shown), thereby holding the inside of the chamber 101 under a specified pressure.

Subsequently, RF power from the first RF power source 105 is applied to the spiral coil 106, while RF power from the second RF power source 108 is applied to the lower electrode 103. The RF power supplied to the spiral coil 106 permits an RF current to flow through the spiral coil 106 and an alternating field generated by the RF current affects the space inside the chamber 101, so that electrons present in the space inside the chamber 101 move in such a direction as to generate a magnetic field that counteracts the magnetic field generated around the spiral coil 106. The movement of the electrons caused by inductive coupling changes the gas in the chamber 101 into a plasma. In this case, since the impedance matcher 107 performs impedance matching, a stable plasma discharge is caused.

By causing the plasma generated in the chamber 101 to act on the object 104 to be processed, there can be achieved surface modification of the object 104 to be processed such as surface oxidation, surface nitridation or impurity doping, thin film formation on the surface of the object 104 to be processed, and isotropic dry etching.

By utilizing Vpp (Peak-to-Peak voltage) and Vdc (dc potential at the lower electrode 103) generated by an alternating bias voltage applied by the second RF power source 108 to the lower electrode 103, ions in the plasma are effectively directed to the object 104 to be processed, which enables micro-fabrication by anisotropic dry etching.

The supply of the RF power from the first and second RF power sources 105 and 108 is completed at the time at which the processing of the object 104 is completed. After that, the introduction of the gas into the chamber 101 is terminated and the gas remaining in the chamber 101 is exhausted therefrom. Then, the object 104 to be processed is retrieved from the chamber 101, whereby the plasma processing is completed.

FIG. 19 is a schematic view of an inductively-coupled plasma processing apparatus according to a second conventional embodiment. In FIG. 19, the description of like components used in the inductively-coupled plasma processing apparatus according to the first conventional embodiment shown in FIG. 18 is omitted by providing the same reference numerals. In the second conventional embodiment, a helical coil 109 instead of the spiral coil 106 used in the first conventional embodiment is provided around the circumference of the chamber 101. A method of performing plasma processing by using the inductively-coupled plasma processing apparatus according to the second conventional embodiment is the same as in the first conventional embodiment.

FIG. 20 is a schematic view of the inductively-coupled plasma processing apparatus according to a third conventional embodiment. In FIG. 20, the description of like components used in the inductively-coupled plasma processing apparatus used in the first conventional embodiment is omitted by providing the same reference numerals. In the third conventional embodiment, a multiple spiral coil 110 consisting of four coils connected in parallel is provided instead of the single spiral coil 106 used in the first conventional embodiment. A method of performing plasma processing by using the inductively-coupled plasma processing apparatus according to the third conventional embodiment is the same as in the first conventional embodiment.

In the first and second conventional embodiments, if RF power at a frequency higher than 13.56 MHz is applied to the spiral coil 106 or helical coil 109 to control the electron temperature of the plasma, the reactance ($j\omega L$: where j is an imaginary unit; $\omega$ is the angular frequency of RF power; and L is the inductance of a coil) of the spiral coil 106 or helical coil 109 is increased, so that it becomes difficult to perform impedance matching and hence a plasma discharge is less likely to occur.

To generate a plasma excellently uniform over a large area in the first and second conventional embodiments, the lengths and diameters of the spiral coil 106 and helical coil 109 should be increased, so that the inductance and reactance thereof are inevitably increased.

The third conventional embodiment has been proposed to overcome the foregoing problems, in which the multiple spiral coil 110 is provided in place of the spiral coil 106 provided in the first conventional embodiment, thereby reducing the impedance of the coil. Since impedance matching is performed more easily, a plasma discharge is more likely to occur.

However, in the case of using radio-frequency power in the VHF band at a high frequency of about 30 to 300 MHz to control the electron temperature of the plasma in the inductively-coupled plasma processing apparatus according to the third conventional embodiment, there arises the problem that it is difficult to generate a plasma under a pressure lower than about 20 mTorr.

Therefore, the conventional inductively-coupled plasma processing apparatus is disadvantageous in that it cannot perform excellently equal plasma processing with high precision and reduced damage, since a high-density plasma cannot be generated under extremely low pressure when RF power at a high frequency is applied to control the electron temperature of the plasma.

SUMMARY OF THE INVENTION

In view of the foregoing, it is therefore a first object of the present invention to provide a radio-frequency power applying apparatus whereby radio-frequency power at a high frequency can be supplied efficiently.

A second object of the present invention is to provide a plasma generating apparatus and a plasma generating method whereby plasma can be generated under extremely low pressure.

A third object of the present invention is to provide a plasma processing apparatus and a plasma processing method whereby excellently equal processing can be performed by using plasma with high precision and reduced damage.

The present invention has been achieved based on the finding that, when the length of a coil is adjusted to be approximately an integral multiple of ¼ of the wavelength of radio-frequency power applied to the coil, an initial discharge is more likely to occur and hence a plasma is more likely to be generated.

An apparatus for applying radio-frequency power according to the present invention comprises: a radio-frequency power source for generating radio-frequency power; a coil having a length which is approximately an integral multiple of ¼ of the wavelength of the radio-frequency power generated from the radio-frequency power source, the coil generating a magnetic field when the radio-frequency power from the radio-frequency power source is supplied thereto and a radio-frequency current flows therethrough; and an impedance matcher for matching the impedance of the radio-frequency power source with the impedance of the coil.

In the apparatus for applying radio-frequency power according to the present invention, the coil has a length which is approximately an integral multiple of ¼ of the wavelength of the radio-frequency power generated from the radio-frequency power source, so that a standing wave is easily produced on the coil, resulting in an increased peak value of a voltage generated on the coil. This enables efficient supply of the radio-frequency power even when the frequency of the radio-frequency power is high.

In the apparatus for applying radio-frequency power according to the present invention, the length of the coil is preferably within tolerances of ±7% of an integral multiple of ¼ of the wavelength of the radio-frequency power. The arrangement positively produces a standing wave on the coil, which surely increases the peak value of the voltage generated on the coil.

More preferably, the length of the coil is approximately ¼ or ½ of the wavelength of the radio-frequency power. Since a short coil is sufficient for the arrangement, the resistance component of the impedance of the coil can be suppressed, resulting in an improved efficiency with which the radio-frequency power is supplied. Accordingly, when the apparatus and method for applying radio-frequency power are applied to the apparatus and method for generating plasma, a discharge is more likely to be initiated and hence a plasma is more likely to be generated.

More preferably, the length of the coil is within tolerances of ±7% of ¼ or ½ of the wavelength of the radio-frequency power. The arrangement improves the efficiency with which the radio-frequency power is supplied, while increasing the peak value of the voltage generated on the coil.

Preferably, the radio-frequency power has a frequency ranging from 30 to 300 MHz. In the conventional embodiments, an increased reactance makes it difficult to perform impedance matching, which reduces the efficiency with which radio-frequency power is supplied. In accordance with the present invention, however, radio-frequency power at a frequency of 30 to 300 MHz can be supplied efficiently. Accordingly, when the apparatus and method for applying radio-frequency power are applied to the apparatus and method for generating plasma, the electron temperature of the plasma can be controlled easily.

Preferably, the impedance matcher is composed of at least two variable capacitors. This improves the stability, controllability, and reliability of the impedance matcher.

Preferably, the coil is composed of a plurality of coil elements arranged symmetrically with respect to the center of the coil, each of the coil elements having a length which is approximately an integral multiple of ¼ of the wavelength of the radio-frequency power. Compared with a single, indiscrete spiral coil, each coil element composing the multiple spiral coil has a reduced length, which suppresses the resistance component of the impedance of the coil and improves the efficiency with which radio-frequency power is supplied. Accordingly, when the apparatus and method for applying radio-frequency power are applied to the apparatus and method for generating plasma, a discharge is more likely to be initiated and a plasma is more likely to be generated. Moreover, since the diameter of the coil can be increased easily, a uniform plasma can be generated over a large area, thereby equally processing the object to be processed.

More preferably, each of the plurality of coil elements has a circular arc portion located on the circumference of a single circle. The arrangement can further reduce the length of each coil element composing the multiple spiral coil, which further improves the efficiency with which radio-frequency power is supplied and enables the generation of a more uniform plasma over a large area.

If the coil is formed in the shape of a two-dimensional spiral, the coil is easily placed in a position opposed to the object to be processed when the apparatus for applying radio-frequency power is applied to the apparatus for processing with plasma. In this case, the two-dimensional spiral configuration indicates a continuous curve winding around a central point, which increases in diameter as it advances outwardly.

Alternatively, if the coil is formed in the shape of a three-dimensional spiral or helix, the coil is easily placed around the chamber when the apparatus for applying radio-frequency power is applied to the apparatus for processing with plasma. In this case, the three-dimensional spiral configuration indicates a continuous curve winding around a central point, which increases in diameter or maintains a constant diameter as it advances outwardly perpendicularly to the radial direction.

An apparatus for generating plasma according to the present invention comprises: a chamber having an inside held under vacuum; gas introducing means for introducing gas into the chamber; a radio-frequency power source for generating radio-frequency power; a coil having a length which is approximately an integral multiple of ¼ of the wavelength of the radio-frequency power, the coil generating a magnetic field for changing the gas introduced into the chamber into a plasma when the radio-frequency power from the radio-frequency power source is supplied thereto and a radio-frequency current flows therethrough; and an impedance matcher for matching the impedance of the radio-frequency power source with the impedance of the coil.

In the apparatus for generating plasma according to the present invention, the coil has a length which is approximately an integral multiple of ¼ of the wavelength of the radio-frequency power generated from the radio-frequency power source, so that the peak value of the voltage generated on the coil is increased as described above. Consequently, the electrons in the chamber are accelerated effectively, which enables the generation of a plasma under extremely low pressure even with the application of radio-frequency power at a high frequency.

An apparatus for processing with plasma according to the present invention comprises: a chamber having an inside held under vacuum; a sample stage provided in the chamber to support an object to be processed; gas introducing means for introducing gas into the chamber; a radio-frequency power source for generating radio-frequency power; a coil having a length which is approximately an integral multiple of ¼ of the wavelength of the radio-frequency power, the coil generating a magnetic field for changing the gas introduced into the chamber into a plasma when the radio-frequency power from the radio-frequency power source is supplied thereto and a radio-frequency current flows therethrough; and an impedance matcher for matching the impedance of the radio-frequency power source with the impedance of the coil.

In the apparatus for generating plasma according to the present invention, the coil has a length which is approximately an integral multiple of ¼ of the wavelength of the radio-frequency power generated from the radio-frequency power source, so that the peak value of the voltage generated on the coil is increased as described above. Consequently, a plasma can be generated under extremely low pressure even with the application of radio-frequency power at a high frequency, resulting in excellently equal plasma processing with high precision and low damage.

Preferably, the apparatus for processing with plasma according to the present invention further comprises voltage applying means for applying, to the sample stage, at least one of a radio-frequency voltage and a constant voltage which are electrically insulated from the chamber. This facilitates the control of the energy of the ions used for plasma processing, while allowing subtle adjustment and control of the energy of the ions, resulting in increased controllability of the plasma processing.

More preferably, the apparatus for processing with plasma according to the present invention further comprises: a first pulse modulator for performing pulse modulation with respect to the radio-frequency power generated from the radio-frequency power source; and a second pulse modulator for performing pulse modulation with respect to the voltage applied by the voltage applying means. In the arrangement, pulse modulation performed with respect to the radio-frequency power generated from the radio-frequency power source increases the controllability of the degree of dissociation of the generated plasma and the controllability of the composition of the plasma. On the other hand, pulse modulation performed with respect to the voltage applied by the voltage applying means enables the application of the radio-frequency bias voltage or dc bias voltage each through pulse modulation to the sample stage, resulting in plasma processing with radicals and ions controlled qualitatively and quantitatively.

A method of applying radio-frequency power according to the present invention comprises the steps of: applying radio-frequency power generated from a radio-frequency power source to a coil having a length which is approximately an integral multiple of ¼ of the wavelength of the radio-frequency power via an impedance matcher for matching the impedance of the radio-frequency power source with the impedance of the coil; and generating a magnetic field around the coil with a radio-frequency current flowing through the coil.

In accordance with the method of applying radio-frequency power according to the present invention, the coil has a length which is approximately an integral multiple of ¼ of the wavelength of the radio-frequency power generated from the radio-frequency power source. Accordingly, a standing wave is likely to be produced on the coil, resulting in an increased peak value of the voltage generated on the coil.

In the method of applying radio-frequency power according to the present invention, the length of the coil is preferably within tolerances of ±7% of an integral multiple of ¼ of the wavelength of the radio-frequency power.

More preferably, the length of the coil is approximately ¼ or ½ of the wavelength of the radio-frequency power.

More preferably, the length of the coil is within tolerances of ±7% of ¼ or ½ of the wavelength of the radio-frequency power.

Preferably, the radio-frequency power has a frequency ranging from 30 to 300 MHz.

Preferably, the impedance matcher is composed of at least two variable capacitors.

More preferably, the coil is composed of a plurality of coil elements arranged symmetrically with respect to the center of the coil, each of the coil elements having a length which is approximately an integral multiple of ¼ of the wavelength of the radio-frequency power.

More preferably, each of the plurality of coil elements has a circular arc portion located on the circumference of a single circle.

Preferably, the coil is formed in the shape of a two-dimensional spiral.

Preferably, the coil is formed in the shape of a three-dimensional spiral or helix.

A method of generating plasma according to the present invention comprises the steps of: introducing gas into a chamber having an inside held under vacuum; applying radio-frequency power generated from a radio-frequency power source to a coil having a length which is approximately an integral multiple of ¼ of the wavelength of the radio-frequency power via an impedance matcher for matching the impedance of the radio-frequency power source with the impedance of the coil; generating a magnetic field around the coil with a radio-frequency current flowing through the coil; and changing the gas introduced into the chamber into a plasma with the magnetic field generated around the coil.

In accordance with the method of generating plasma according to the present invention, the coil has a length which is approximately an integral multiple of ¼ of the wavelength of the radio-frequency power generated from the radio-frequency power source, so that the peak value of the voltage generated on the coil is increased as described above.

A method of processing with plasma according to the present invention comprises the steps of: placing an object to be processed on a sample stage provided in a chamber having an inside held under vacuum; introducing gas into the chamber; applying radio-frequency power generated from a radio-frequency power source to a coil having a length which is approximately an integral multiple of ¼ of the wavelength of the radio-frequency power via an impedance matcher for matching the impedance of the radio-frequency power source with the impedance of the coil; generating a magnetic field around the coil with a radio-frequency current flowing through the coil; changing the gas introduced into the chamber into a plasma with the magnetic field generated around the coil; and processing the object to be processed placed on the sample stage with the gas changed into the plasma.

In accordance with the method of processing with plasma according to the present invention, the coil has a length which is approximately an integral multiple of ¼ of the wavelength of the radio-frequency power generated from the radio-frequency power source, so that the peak value of the voltage generated on the coil is increased as described above.

Preferably, the method of processing with plasma according to the present invention further comprises the step of applying, to the sample stage, at least one of a radio-frequency voltage and a constant voltage which are electrically insulated from the chamber.

More preferably, the method of processing with plasma according to the present invention further comprises the steps of: performing pulse modulation with respect to the radio-frequency power applied to the coil; and performing pulse modulation with respect to the voltage applied to the sample stage.

DETAILED DESCRIPTION OF THE INVENTION

Below, RF power applying apparatus, plasma generating apparatus, and plasma processing apparatus according to the individual embodiments of the present invention will be described with reference to-the drawings.

First Embodiment

Figure 1A:
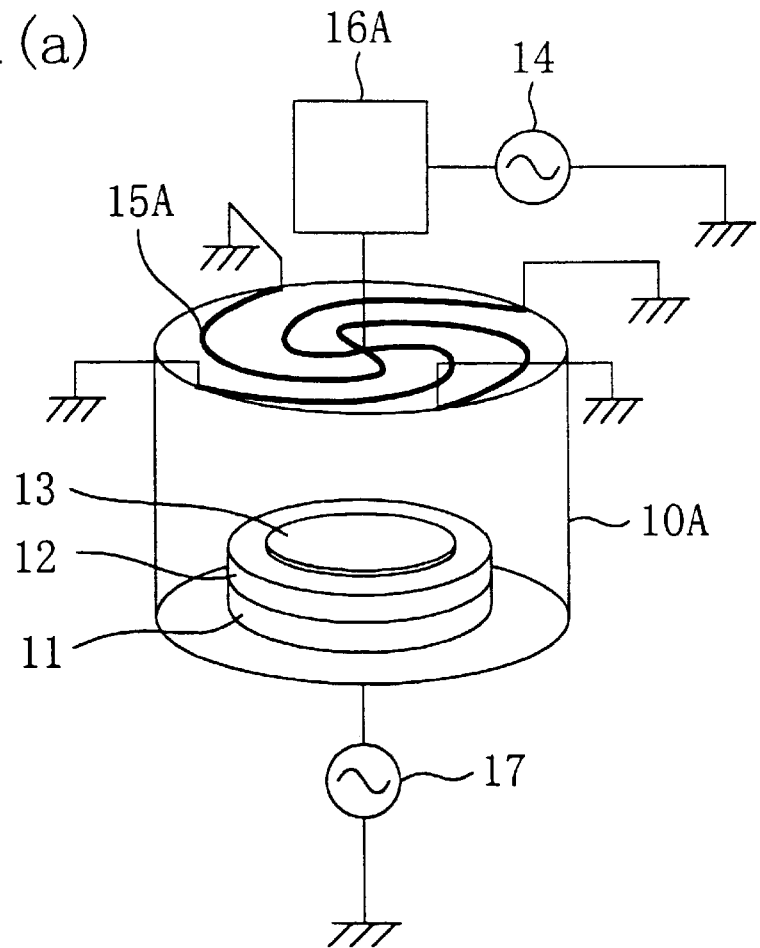
FIG. 1(a) is a schematic view showing the structure of a plasma processing apparatus according to a first embodiment of the present invention and FIG. 1(b) is a plan view of a multiple spiral coil in the plasma processing apparatus according to the first embodiment.
Figure 2:
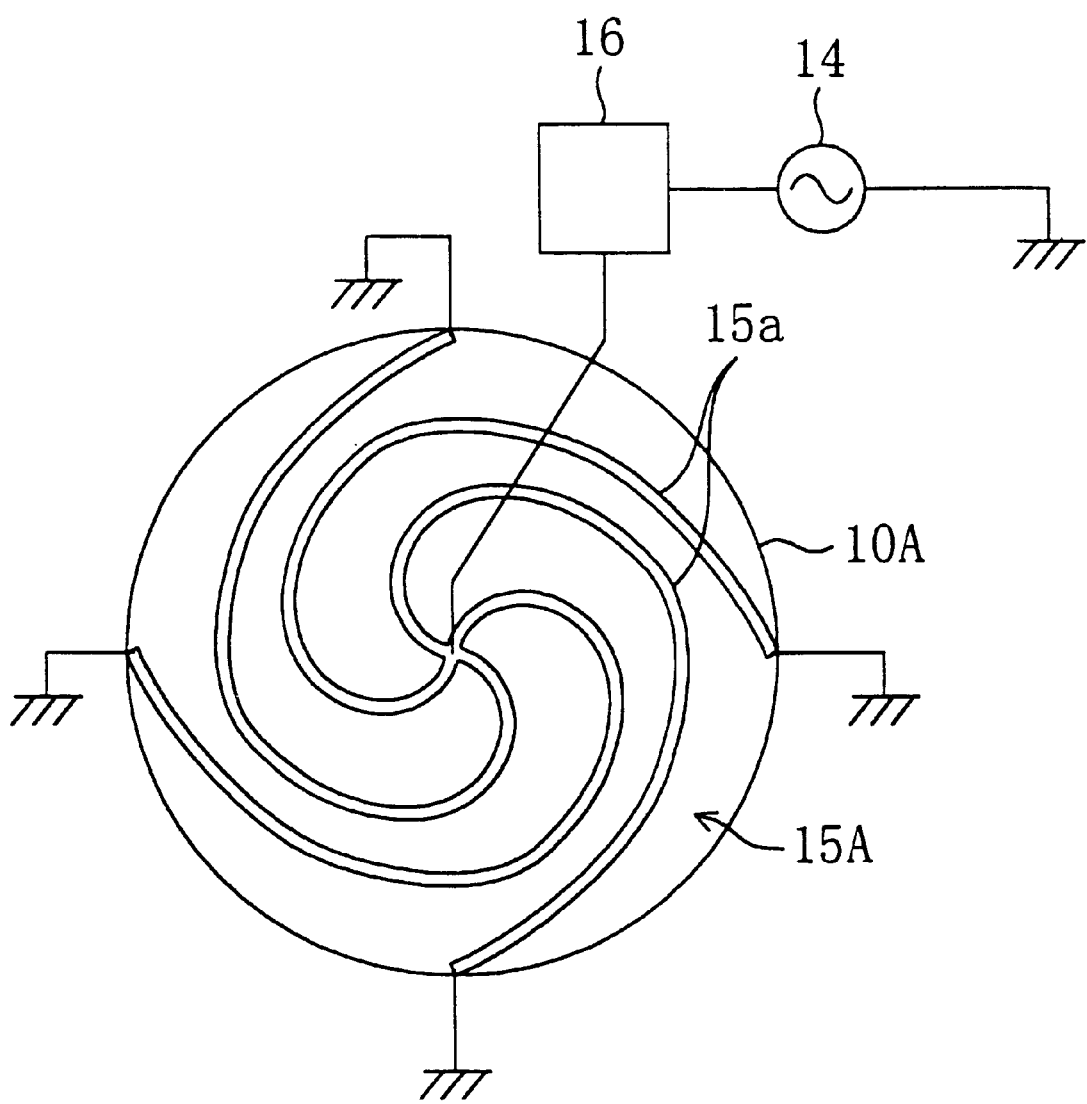
FIG. 2 is a schematic view showing the structure of an RF power applying apparatus used in the plasma processing apparatus according to the first embodiment.

FIG. 1(a) schematically shows the structure of a plasma processing apparatus according to a first embodiment of the present invention. FIG. 2 schematically shows the structure of an RF power applying apparatus used in the plasma processing apparatus according to the first embodiment.

In FIG. 1(a), there is shown a cylindrical chamber 10A having its inside held under a specified pressure. The chamber 10A is provided with: gas introducing means for introducing gas into the chamber 10A: exhaust means for exhausting the gas from the chamber 10A; and carrying means for carrying an object to be processed in and out of the chamber 10A, though the drawing thereof is omitted.

On the bottom of the chamber 10A, there is provided a lower electrode (sample stage) 12 with intervention of an insulator 11. The lower electrode 12 supports an object 13 to be processed such as a semiconductor wafer, which is subjected to etching or film deposition.

Figure 1B:
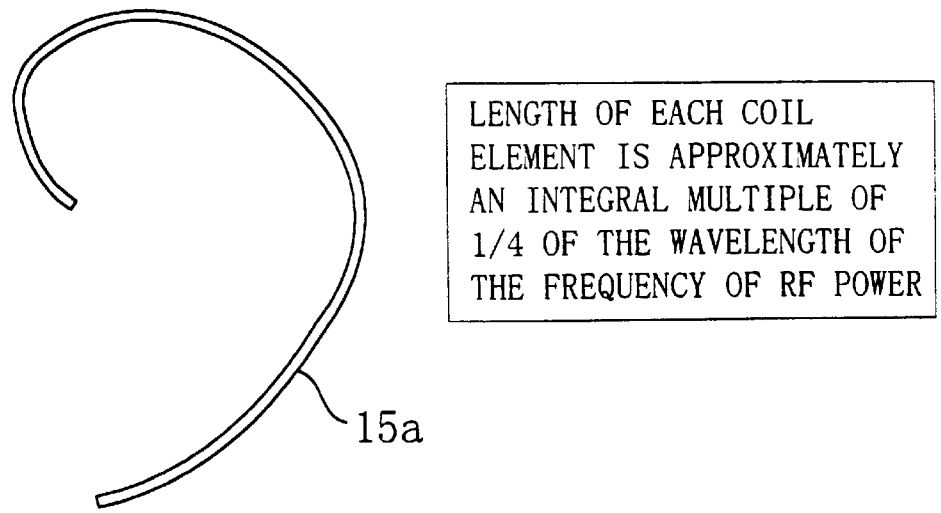

Above the chamber 10A, there are provided a first RF power source 14 for outputting RF power at a frequency of, e.g., 100 MHz and a multiple spiral coil 15A consisting of four spiral coil elements 15a (see FIG. 1(b)) electrically connected in parallel and each having one terminal grounded. The first RF power source 14 is connected in common to the other terminals of the coil elements 15a via an impedance matcher 16A.

The RF power applying apparatus used in the plasma processing apparatus according to the first embodiment is composed of: the first RF power source 14; the impedance matcher 16A; and the multiple spiral coil 15A. The RF power applying apparatus applies RF power generated from the first RF power source 14 to the multiple spiral coil 15A via the impedance matcher 16A.

The first embodiment is characterized in that the length of each coil element 15a composing the multiple spiral coil 15A is adjusted to be 75 cm, which corresponds to ¼ of the wavelength (3 m) of the RF power supplied from the first RF power source 14.

Below the chamber 10A, there is provided a second RF power source 17. The second RF power source 17 is electrically insulated from the chamber 10A and the insulator 11, while it is electrically connected to the lower electrode 12. The second RF power source 17 applies an RF bias voltage to a plasma generated in the chamber 10A. The frequency of RF power for generating the RF bias voltage typically ranges from several hundreds of kilohertz to 13.56 megahertz.

For safety, the ground potential of each of the first and second RF power sources 14 and 17 and the ground potential of the multiple spiral coil 15A are adjusted to be equal to the ground potential of the chamber 10A.

Below, a description will be given to plasma processing performed by using the RF power applying apparatus and plasma processing apparatus described above.

Initially, the object 13 to be processed is carried in the chamber 10A by the carrying means (not shown) and placed on the lower electrode 12. Thereafter, gas is introduced into the chamber 10A by the gas introducing means (not shown) and the gas in the chamber 10A is exhausted therefrom by the exhaust means (not shown), thereby holding the inside the chamber 10A under a specified pressure.

Subsequently, the RF power is supplied from the first RF power source 14 to the multiple spiral coil 15A, while the RF power is supplied from the second RF power source 17 to the lower electrode 12. The RF power thus supplied to the multiple spiral coil 15A allows an RF current to flow through the multiple spiral coil 15A and an alternating field generated by the RF current acts on the space inside the chamber 10A, so that electrons present in the space inside the chamber 10A move in such a direction as to generate a magnetic field that counteracts the magnetic field generated around the multiple spiral coil 15A. The movement of the electrons caused by inductive coupling changes the gas in the chamber 10A into a plasma. In this case, since the impedance matcher 16 performs impedance matching, a stable plasma discharge is caused.

By causing the plasma generated in the chamber 10A to act on the object 13 to be processed, there can be achieved surface modification of the object 13 to be processed such as surface oxidation, surface nitridation or impurity doping, thin film formation on the surface of the object 13 to be processed, and isotropic dry etching.

By utilizing Vpp (Peak-to-Peak voltage) and Vdc (dc potential at the lower electrode 12) generated by the alternating bias voltage from the second RF power source 17 applied to the lower electrode 12, ions in the plasma are effectively directed to the object 13 to be processed, which enables micro-fabrication by anisotropic dry etching.

The supply of the RF power from the first and second RF power sources 14 and 17 is completed at the time at which the processing of the object 13 to be processed is completed. After that, the introduction of the gas into the chamber 10A is terminated and the gas remaining in the chamber 10A is exhausted therefrom. Then, the object 13 to be processed is retrieved from the chamber 10A, whereby the plasma processing is completed.

Below, a detailed description will be given to the reason for adjusting the length of each coil element 15a composing the multiple spiral coil 15A to be ¼ of the wavelength of the RF power supplied from the first RF power source 14.

In general, the wavelength of RF power becomes shorter as the frequency thereof becomes higher. When the dimension of an object through which the RF power propagates becomes closer to the wavelength of the RF power, an effect due to wavelength is observed. Specifically, when the dimension of the object through which the RF power propagates becomes an integral multiple of ¼ of the frequency of the RF power such as ¼, ½, or 1/1 of the wavelength of the RF power, a kind of resonant phenomenon is observed, which is positively utilized by an antenna and a receiver. Normally, an antenna has an open terminal so that only an electromagnetic wave coupled to a medium around the antenna and resonant with the structure of the antenna is projected from the terminal of the antenna to the medium around the antenna or absorbed from the medium around the antenna into the terminal of the antenna.

In an RF propagation system different from the antenna in which an RF current flows through a coil, i.e., a system in which the coil has one terminal receiving RF power and the other terminal grounded, if the length of the coil is an integral multiple of ¼ of the frequency of the RF power, a standing wave is likely to be produced on the coil and consequently the peak value of a voltage generated on the coil is large. As described above, when the inductively-coupled plasma generating apparatus is in a transient state before a discharge is initiated, an electric field induced in the chamber by the voltage generated on the coil accelerates electrons in the chamber. In other words, a discharge initiated by capacitive coupling causes an avalanche of ionization, which shifts to an inductively coupled state when an increasing electron density reaches a certain value, thus maintaining the discharge. Hence, the discharge is more likely to be initiated as the peak value of the voltage generated on the coil is higher.

From the foregoing description, it can be deduced that, when the length of each coil element is an integral multiple of ¼ of the wavelength of the RF power, the standing wave is more likely to be produced on the coil and consequently the peak value of the voltage generated on the coil is increased, which facilitates the initiation of a discharge and the generation of the plasma.

It can also be deduced that, when the length of the coil is increased, the resistance component of the impedance of the coil is increased to reduce power efficiency, which hinders the initiation of a discharge. Therefore, even when the length of the coil is an integral multiple of the wavelength of the RF power, a discharge is more likely to be initiated as the length of each coil element is shorter. Accordingly, a discharge is most likely to be initiated when the length of the coil is ¼ of the wavelength, second most likely to be initiated when the length of the coil is ½ of the wavelength, and third most likely to be initiated when the length of the coil is ¾ of the wavelength.

To equally process an object to be processed by forming a uniform plasma over a large area, the diameter of the coil should be about 1.5 to 2 times as large as the diameter of the object to be processed.

To form the uniform plasma over a large area, the number of turns of winding of the spiral coil is also important as well as the large diameter of the coil. When four spiral coils each having 2 turns of winding are connected in parallel to form a multiple spiral coil having a multiplicity of four, equal processing comparable to processing achieved with a single spiral coil having 8 turns of winding can be achieved.

Thus, the use of the multiple spiral coil achieves a reduction in the length of the coil and facilitates the generation of a uniform plasma over a large area. In short, the use of the multiple spiral coil allows a more efficient use of the effect due to the wavelength.

Below, a description will be given to an evaluation test performed to confirm the effects of the first embodiment.

As the gas, $C_4F_8$ gas is introduced into the chamber 10A, while the pressure inside the chamber 10A is maintained at 20 mTorr, to generate a plasma. The RF bias voltage is then applied to the lower electrode 12 to enable etching of a silicon dioxide film as the object to be processed placed on the lower electrode 12.

Next, argon gas is introduced into the chamber 10A, while the RF power supplied from the first RF power source 14 is varied, to examine a minimum pressure inside the chamber 10A under which a discharge is initiated. When the RF power is 200 W, a discharge is initiated under a pressure equal to or higher than 24 mTorr. When the RF power is 300 W, a discharge is initiated under a pressure equal to or higher than 20 mTorr. When the RF power is 400 W, a discharge is initiated under a pressure equal to or higher than 18 mTorr. In short, the minimum pressure under which a discharge is initiated is lowered as the magnitude of the applied RF power is increased.

Figure 3:
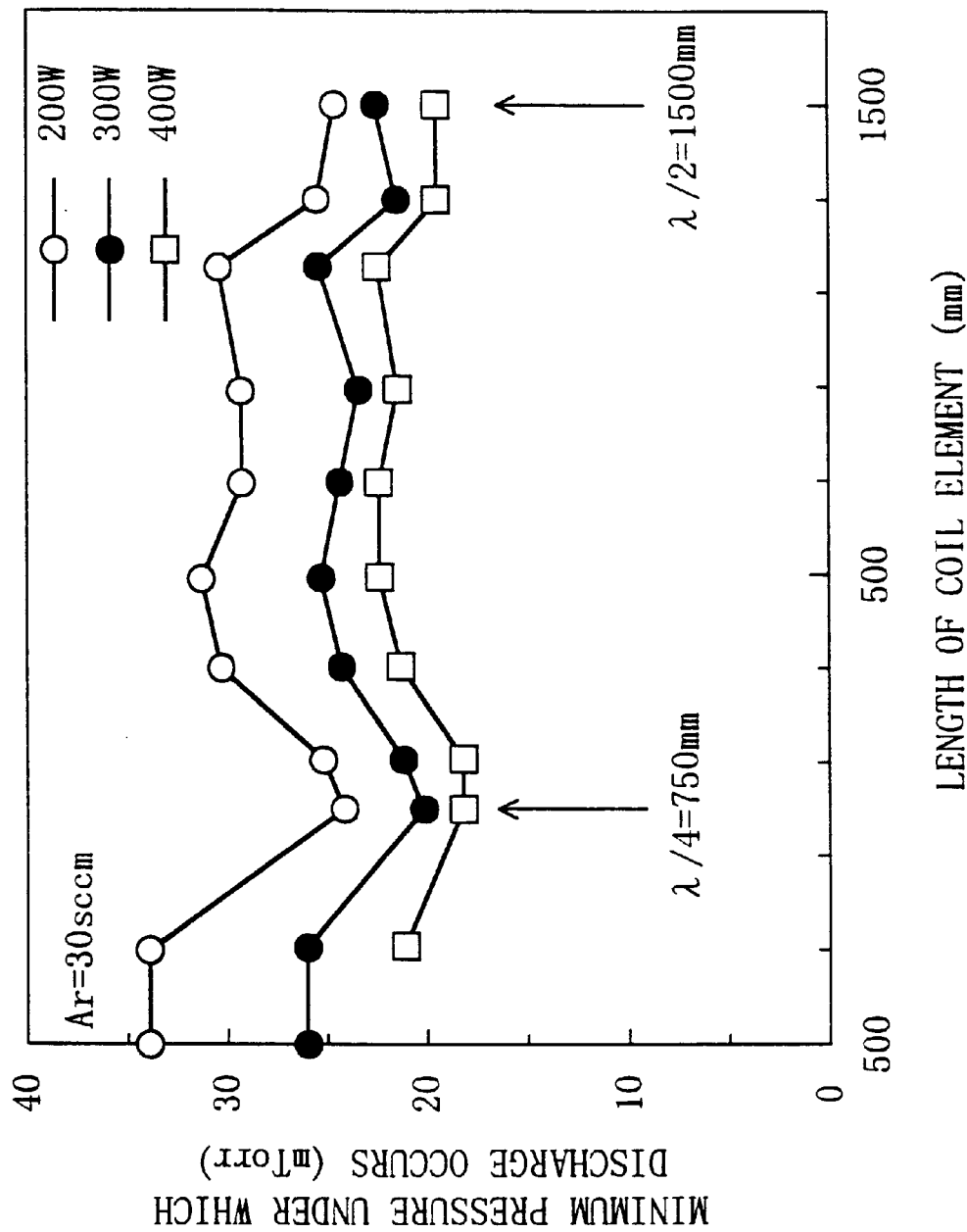
FIG. 3 is a graph showing the relationship between the length of a coil element of the multiple spiral coil and a minimum pressure under which a discharge is initiated in the case where RF power is varied.

Next, in each of the cases where the RF power is 200, 300, and 400 W, the minimum pressure under which a discharge is initiated is examined by varying the length of a coil element, the result of which is shown in FIG. 3. As is apparent from FIG. 3, if the magnitude of the RF power is the same, the minimum pressure under which a discharge is initiated is low, i.e., a discharge is likely to be initiated when the length of the coil is ¼ or ½ of the wavelength of the RF power.

Figure 4:
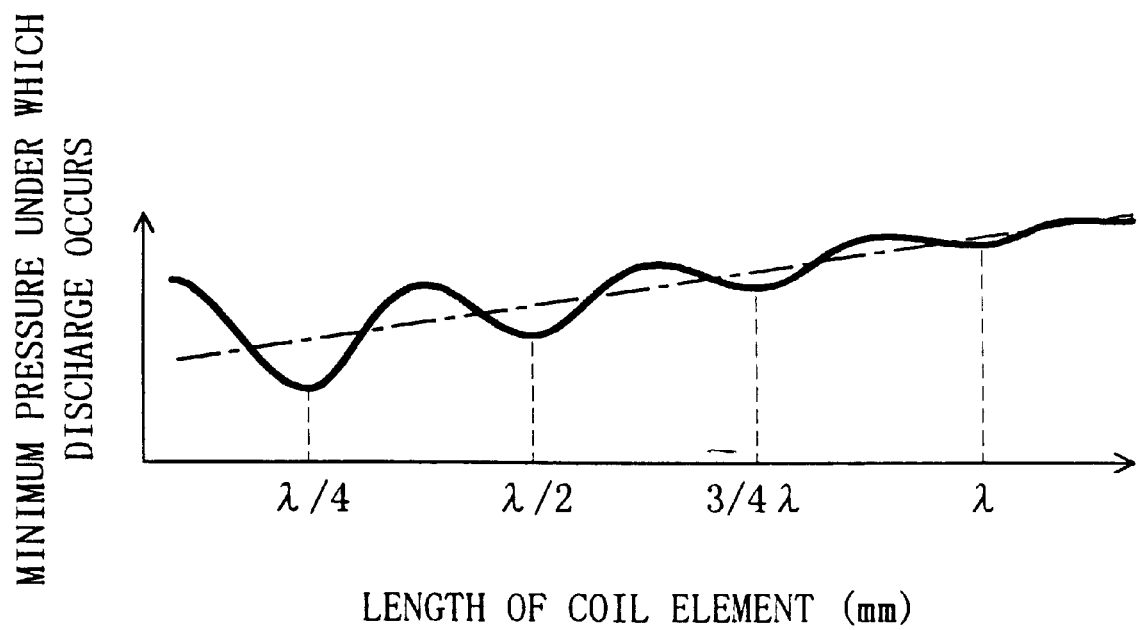
FIG. 4 is a graph showing the relationship between the length of a coil element of the multiple spiral coil and the minimum pressure under which a discharge is initiated in the plasma processing apparatus according to the first embodiment.

FIG. 4 shows the relationship between the length of a coil element and the minimum pressure under which a discharge is initiated in the case where the length of a coil element is varied more greatly. As is apparent from FIG. 4, a discharge is likely to be initiated when the length of the coil element is an integral multiple of ¼ of the wavelength of the RF power. Even when the length of the coil element is an integral multiple of ¼ of the wavelength of the RF power, a discharge is most likely to be initiated when the length of the coil element is ¼ of the wavelength, second most likely to be initiated when the length of the coil element is ½ of the wavelength, and third most likely to be initiated when the length of the coil element is ¾ of the wavelength. That is, although the likelihood of the initiation of a discharge is dependent on the length of the coil element, the dependence is more significant as the length of the coil element is shorter. The use of the multiple spiral coil achieves a reduction in the length of the coil compared with the case of using a simple spiral coil. Consequently, it has been confirmed that a discharge is more likely to be initiated.

Although the description of the length of the coil in the first embodiment has used the expression of "an integral multiple of ¼ of the wavelength of RF power," it is sufficient for the coil to have a length which is approximately ¼ of the wavelength of RF power. Specifically, it has been confirmed that the length of the coil is effective as long as it is within tolerances of ±7% of an integral multiple of the wavelength.

Second Embodiment

Figure 5:
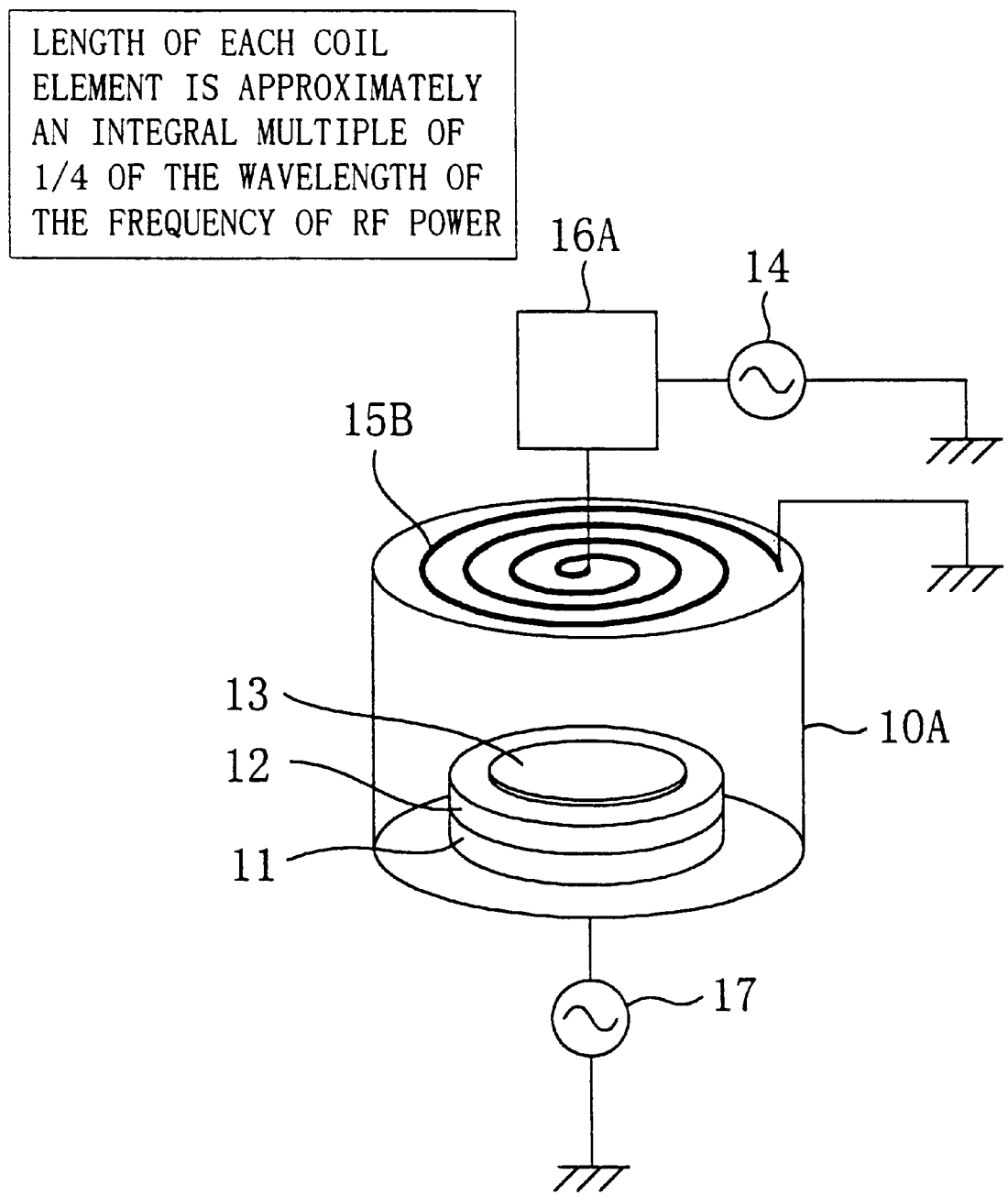
FIG. 5 is a schematic view showing the structure of a plasma processing apparatus according to a second embodiment of the present invention.

FIG. 5 schematically shows the structure of a plasma processing apparatus according to a second embodiment of the present invention. In the second embodiment, the description of like components used in the first embodiment shown in FIG. 1(*a*) is omitted by providing like reference numerals.

The second embodiment is characterized in that a simple spiral coil 15B is provided instead of the multiple spiral coil 15A used in the first embodiment. Compared with the first embodiment, the second embodiment is disadvantageous in terms of forming a plasma covering a large area. However, the second embodiment has an advantage over the first embodiment in terms of forming a plasma covering a small area. In the second embodiment also, it is sufficient for the spiral coil 15B to have a length which is approximately ¼ of the wavelength of RF power.

Third Embodiment

Figure 6:
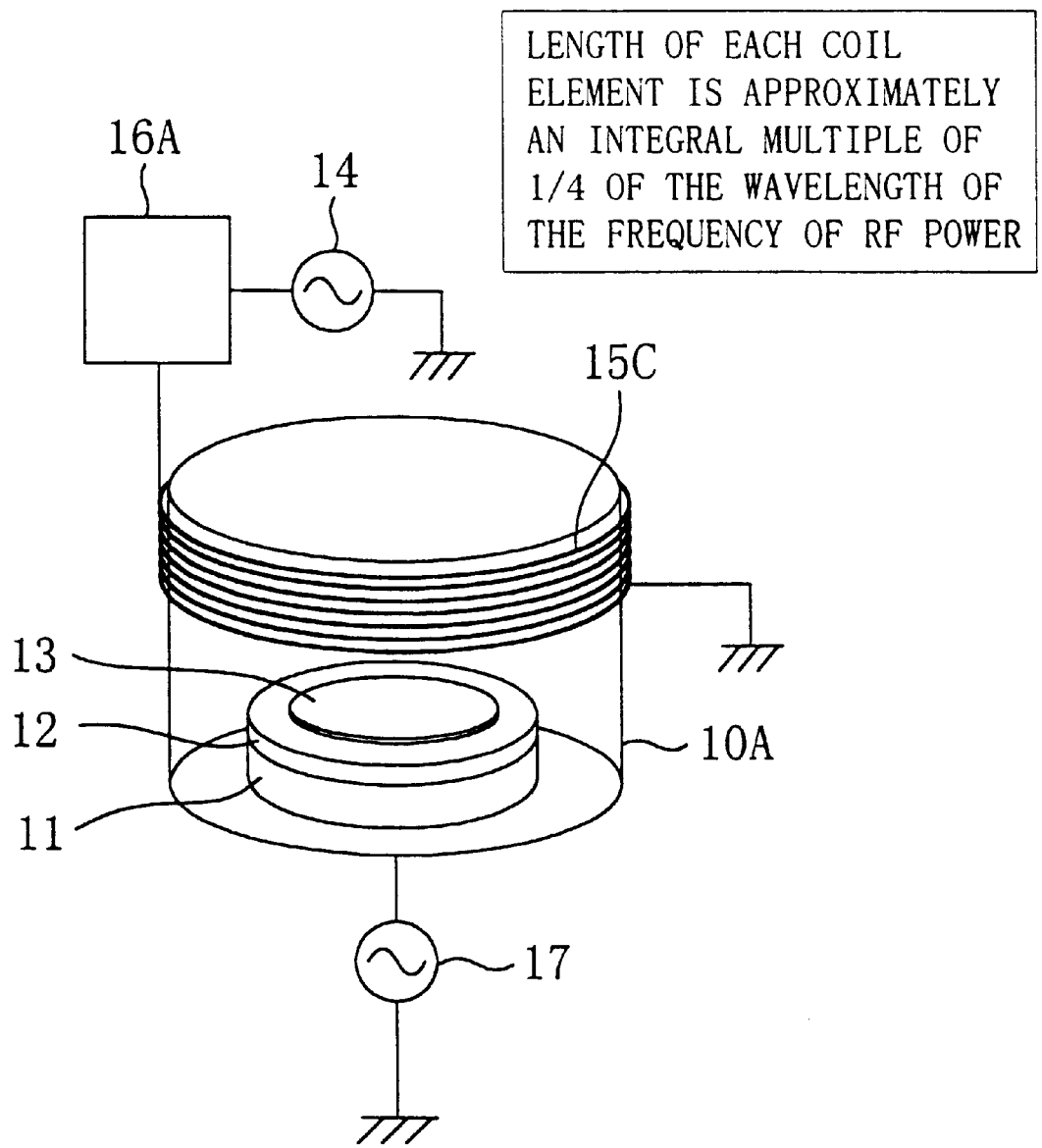
FIG. 6 is a schematic view showing the structure of a plasma processing apparatus according to a third embodiment of the present invention.

FIG. 6 schematically shows the structure of a plasma processing apparatus according to a third embodiment of the present invention. In the third embodiment, the description of like components used in the first embodiment shown in FIG. 1(*a*) is omitted by providing like reference numerals.

The third embodiment is characterized in that a single helical coil 15C wound around the circumference of the cylindrical chamber 10A is provided instead of the multiple spiral coil 15A used in the first embodiment. In the third embodiment also, it is sufficient for the helical coil 15C to have a length which is approximately ¼ of the wavelength of RF power.

Fourth Embodiment

Figure 7:
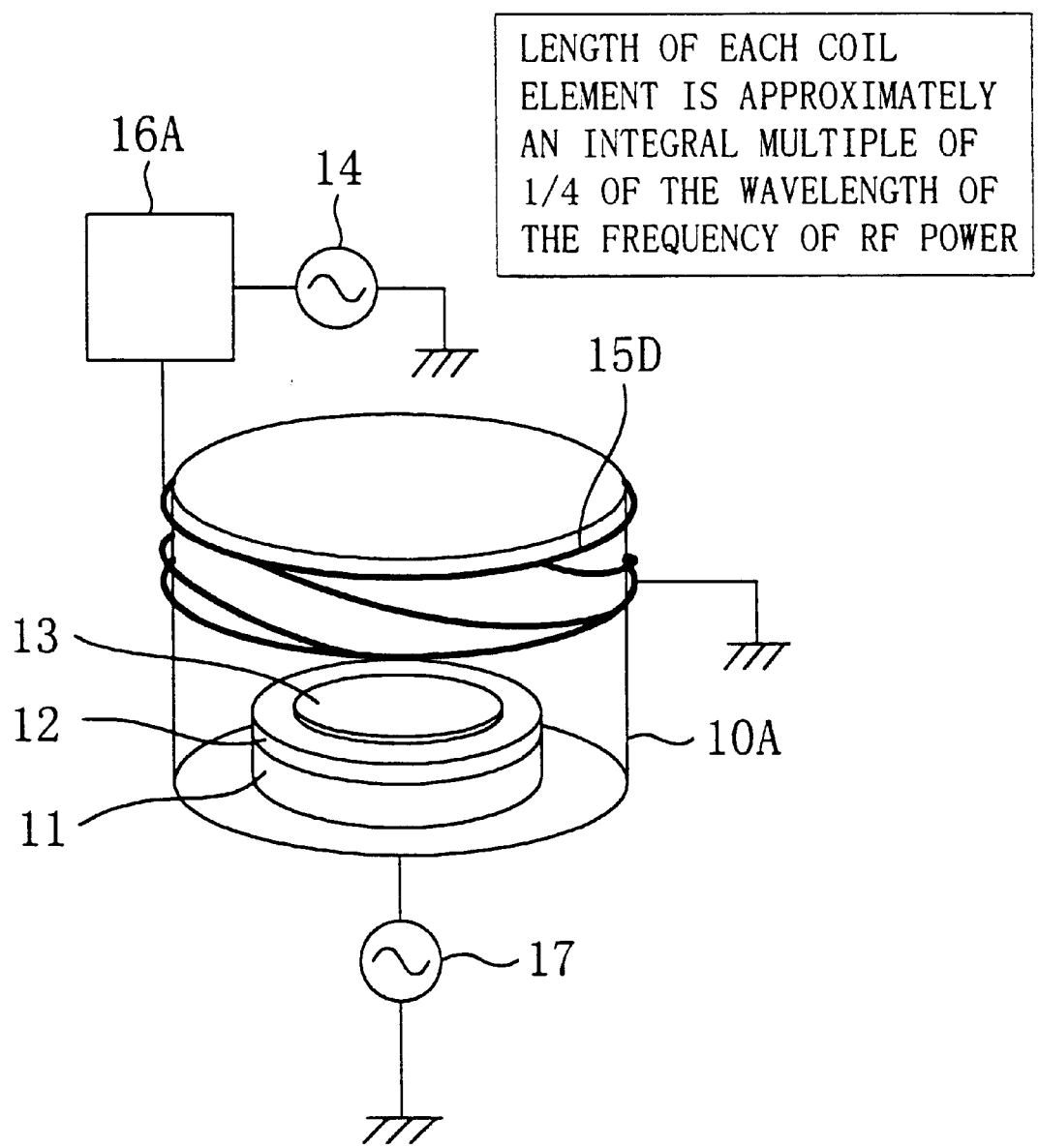
FIG. 7 is a schematic view showing the structure of a plasma processing apparatus according to a fourth embodiment of the present invention.
Figure 8:
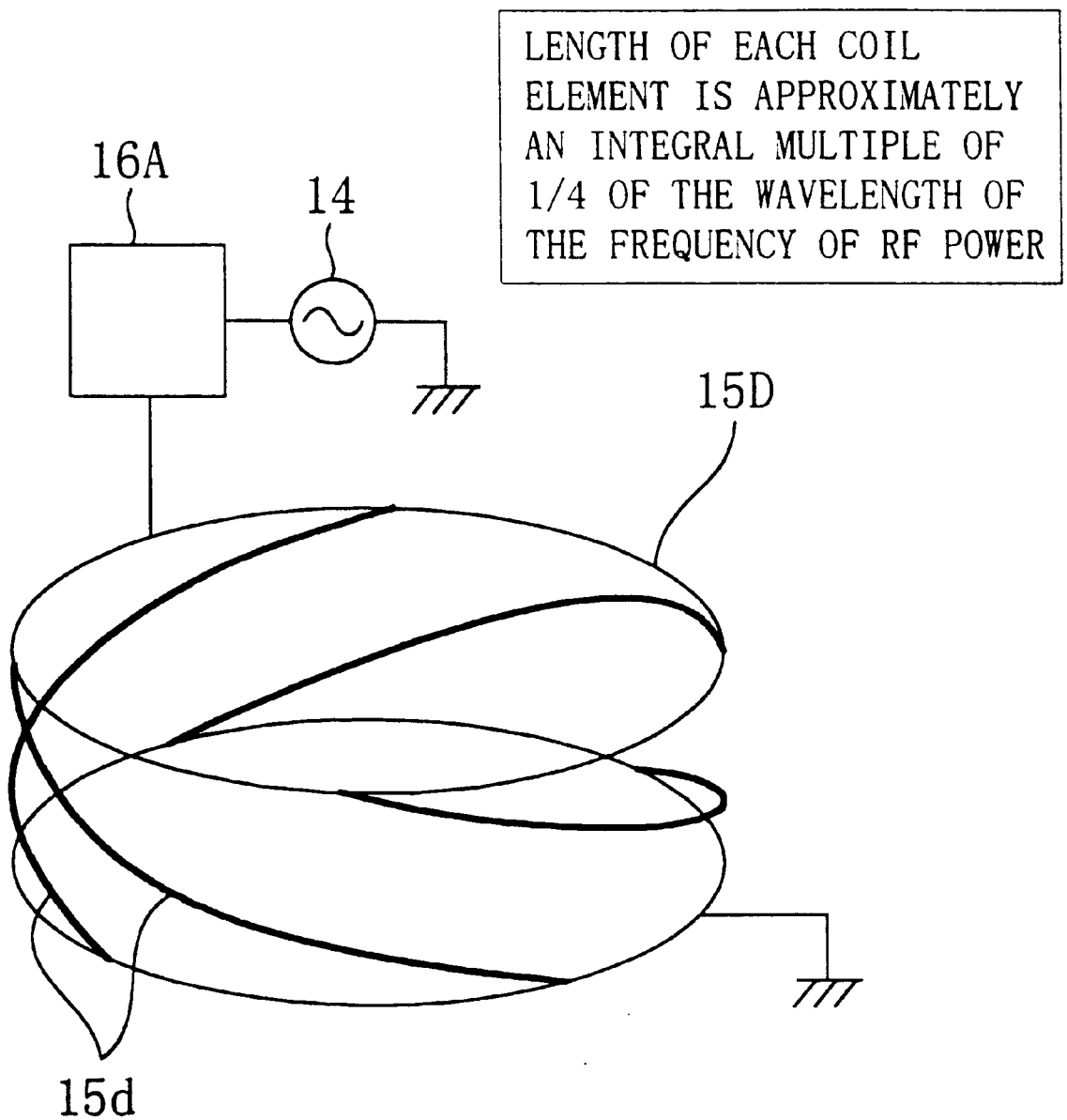
FIG. 8 is a schematic view showing the structure of an RF power applying apparatus used in the plasma processing apparatus according to the fourth embodiment.

FIG. 7 schematically shows the structure of a plasma processing apparatus according to a fourth embodiment of the present invention. FIG. 8 schematically shows the structure of an RF power applying apparatus used in the plasma processing apparatus according to the fourth embodiment. In the fourth embodiment, the description of like components used in the first embodiment shown in FIG. 1(a) is omitted by providing like reference numerals.

The fourth embodiment is characterized in that a multiple spiral coil 15D composed of four helical coils 15d connected in parallel is provided instead of the single helical coil 15C used in the third embodiment. The multiple spiral coil 15D is advantageous in that the length of each coil element 15d can be reduced due to the multiplexing of the coil elements 15d, similarly to the first embodiment. It is sufficient for each of the coil elements 15d connected in parallel to have a length which is approximately ¼ of the wavelength of RF power. The number of coil element 15d or multiplicity may be 2 or more.

Fifth Embodiment

Figure 9:
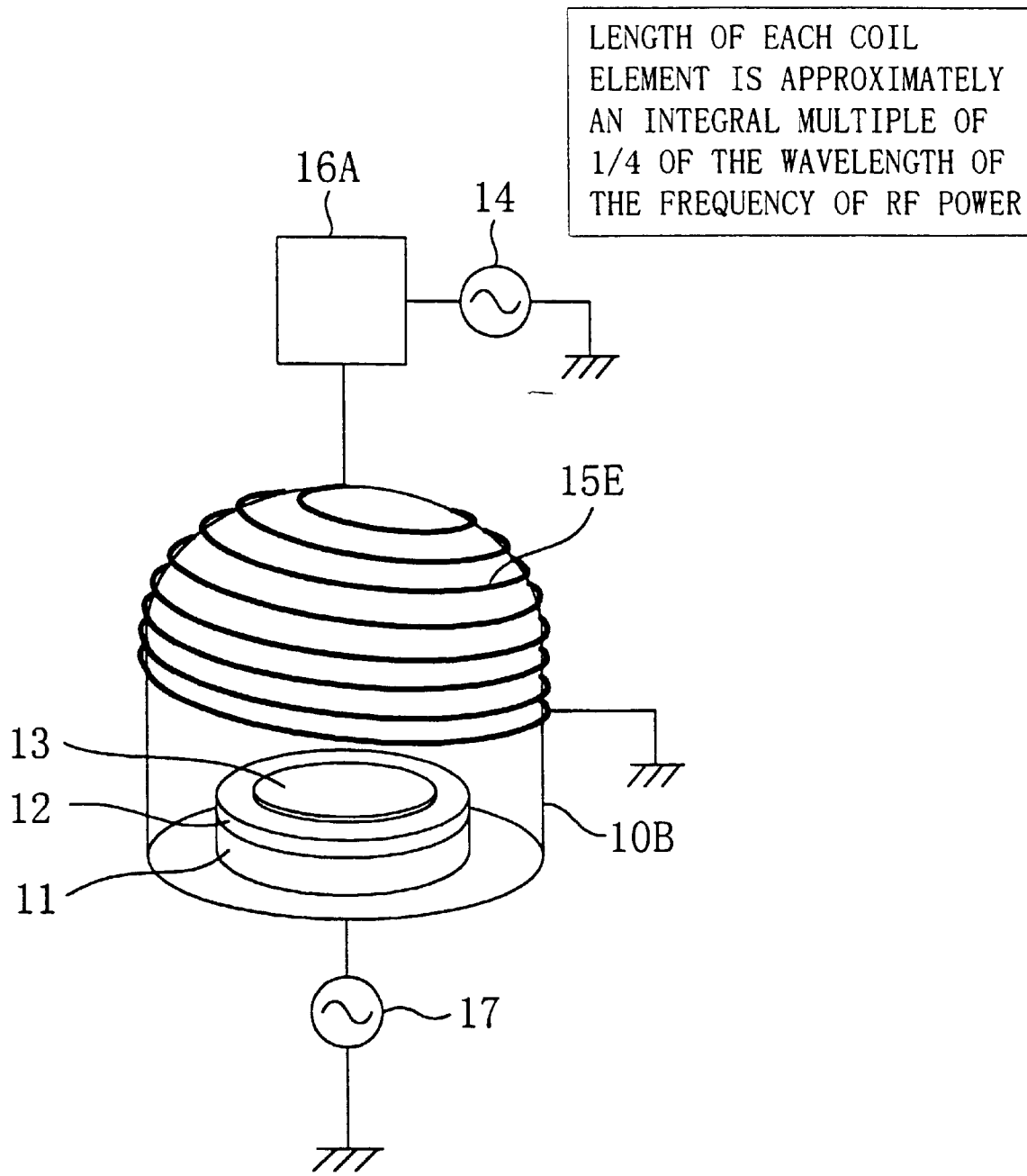
FIG. 9 is a schematic view showing the structure of a plasma processing apparatus according to a fifth embodiment of the present invention.

FIG. 9 schematically shows the structure of a plasma processing apparatus according to a fifth embodiment of the present invention. In the fifth embodiment, the description of like components used in the first embodiment is omitted by providing like reference numerals.

The fifth embodiment is characterized in that a cylindrical chamber 10B having a hemispherical dome portion is provided in place of the cylindrical chamber 10A used in the third embodiment. In addition, a helical coil 15E composed of a plurality of circular coil elements located in the part lower than the central portion and having the same diameter and of a plurality of circular coil elements located in the part upper than the central portion and having diameters gradually decreasing in the upward direction is provided instead of the helical coil 15C composed of a plurality of circular coil elements having the same diameter used in the third embodiment. In the arrangement, the helical coil 15E is provided not only around the object 13 to be processed, but also in a plane opposed to the object 13 to be processed. In the fifth embodiment also, it is sufficient for the helical coil 15E to have a length which is approximately ¼ of the wavelength of RF power. It is also possible to increase the number of spiral coils 15E or multiplicity, thereby forming a multiple spiral coil.

Sixth Embodiment

Figure 10:
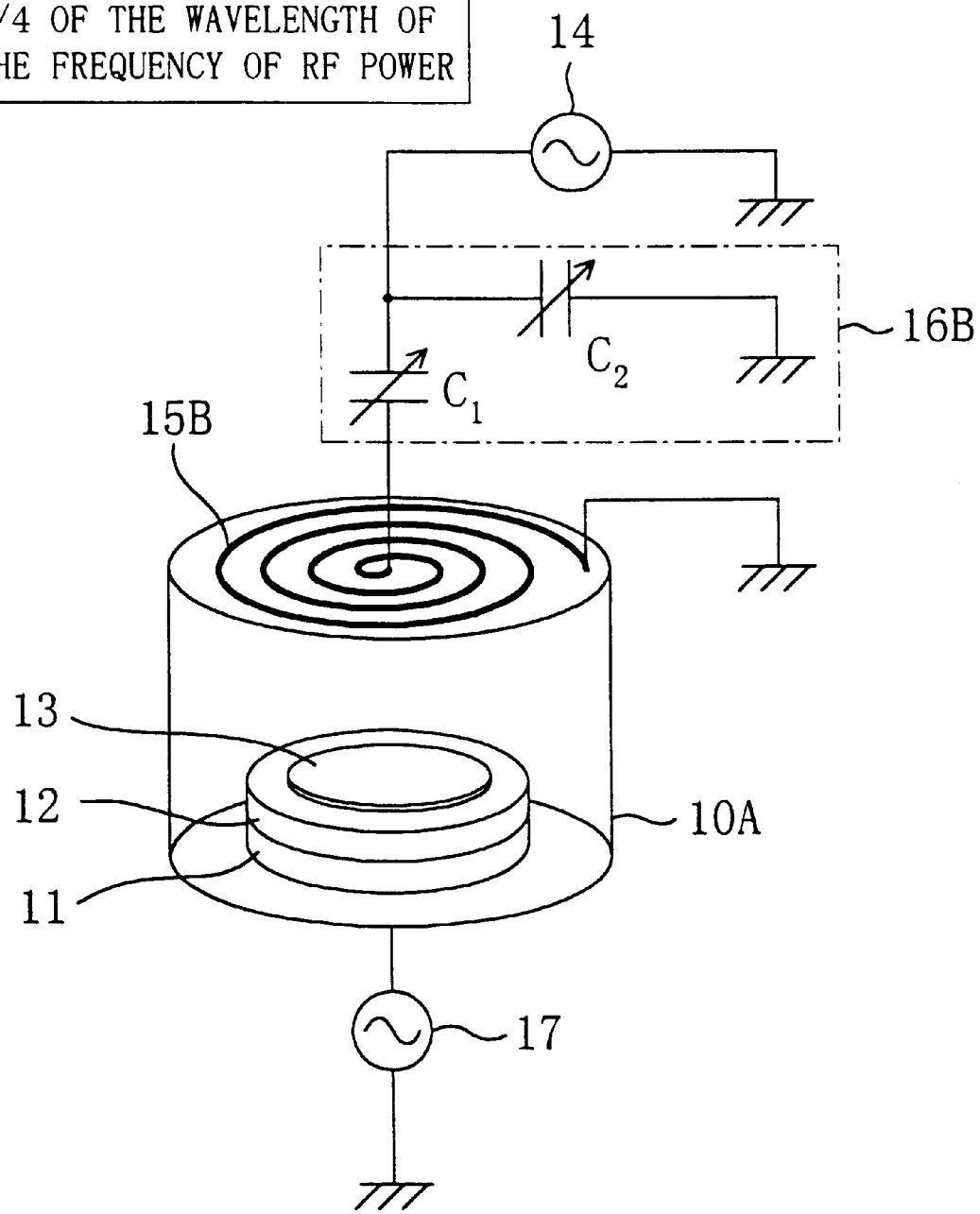
FIG. 10 is a schematic view showing the structure of a plasma processing apparatus according to a sixth embodiment of the present invention.

FIG. 10 schematically shows the structure of a plasma processing apparatus according to a sixth embodiment of the present invention. In the sixth embodiment, the description of like components used in the first embodiment shown in FIG. 1(a) is omitted by providing like reference numerals.

The sixth embodiment is characterized in that the same spiral coil 15B as used in the second embodiment is provided and that an impedance matcher 16B composed of two variable capacitors $C_1$ and $C_2$ is provided in place of the normal impedance matcher 16A.

Seventh Embodiment

Figure 11:
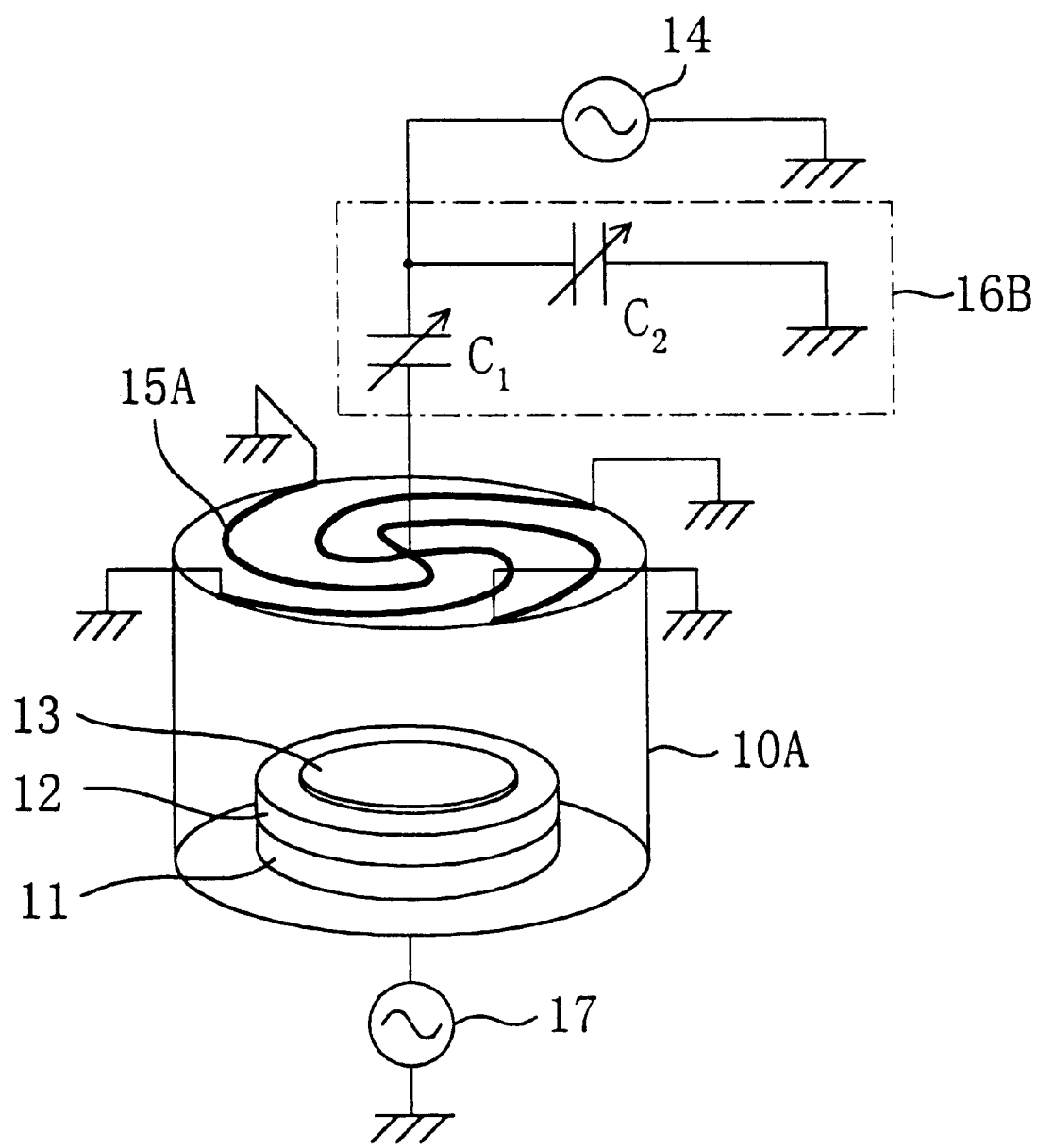
FIG. 11 is a schematic view showing the structure of a plasma processing apparatus according to a seventh embodiment of the present invention.
Figure 12:
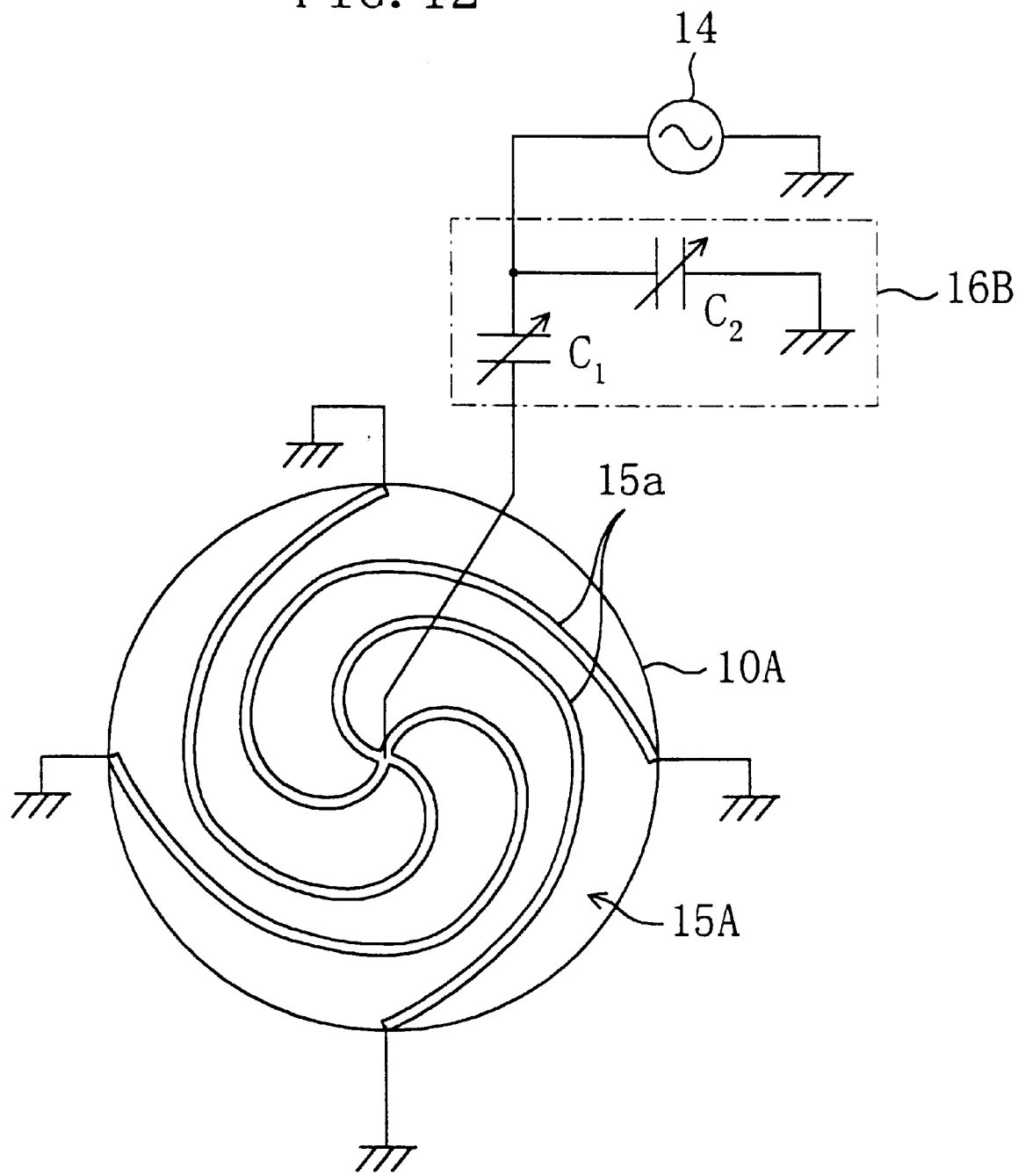
FIG. 12 is a schematic view showing the structure of an RF power applying apparatus used in the plasma processing apparatus according to the seventh embodiment.

FIG. 11 schematically shows the structure of a plasma processing apparatus according to a seventh embodiment of the present invention. FIG. 12 schematically shows the structure of an RF power applying apparatus used in the plasma processing apparatus according to the seventh embodiment. In the seventh embodiment, the description of like components used in the first embodiment shown in FIG. 1(a) is omitted by providing like reference numerals.

The seventh embodiment is characterized in that the multiple spiral coil 15A as used in the first embodiment is provided and that the impedance matcher 16B composed of the two variable capacitors $C_1$ and $C_2$ is provided in place of the normal impedance matcher 16A.

Instead of the normal impedance matcher 16A, the impedance matcher 16B composed of the two variable capacitors $C_1$ and $C_2$ may be provided in the third to fifth embodiment, similarly to the first or second embodiment.

In general, an impedance matcher have different configurations depending on the magnitude of a frequency. In a frequency band around 50 MHz or less, an impedance matcher using a variable capacitor or a variable inductor has been used conventionally. In a frequency band over 50 MHz, however, impedance matching is less likely to be performed by means of the impedance matcher using the variable capacitor or variable inductor since a transient current is easily allowed to flow due to the difficulty with which impedance matching is performed. To overcome the difficulty, a stub has been used conventionally as an impedance matcher in a high frequency band of 100 MHz or more. However, since the stub is inferior in stability, controllability, and reliability, an impedance matcher composed of a variable capacitor is preferred to the stub.

However, since the first to fifth embodiments have adjusted the length of a coil to be approximately an integral multiple of ¼ of the wavelength of RF power, the peak value of the voltage generated on the coil is increased so that a plasma is easily generated without applying RF power at a high frequency over 50 MHz. Hence, there can be used the impedance matcher 16B composed of the two variable capacitors $C_1$ and $C_2$.

In the first to fifth embodiments, RF power at 30 to 300 MHz is supplied from the first RF power source 14 and a plasma discharge is caused by performing impedance matching by means of the impedance matcher 16B composed of the two variable capacitors $C_1$ and $C_2$, with the result that an excellent impedance matching characteristic and a stable plasma discharge are reproduced with high fidelity.

Eighth Embodiment

Figure 13A:
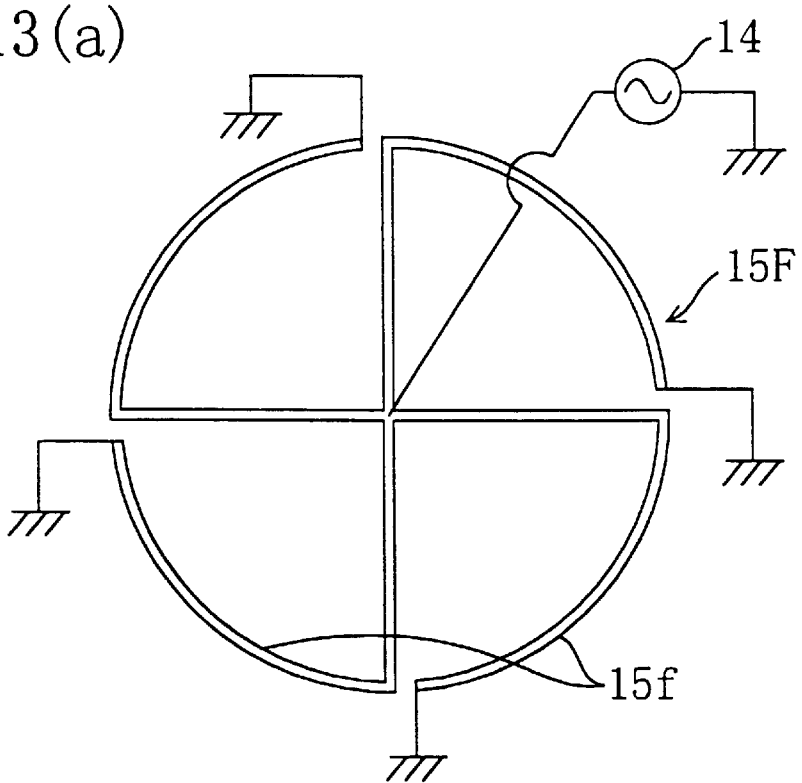
FIGS. 13(a) and 13(b) are schematic views showing the structure of an RF power applying apparatus according to an eighth embodiment of the present invention.
Figure 13B:
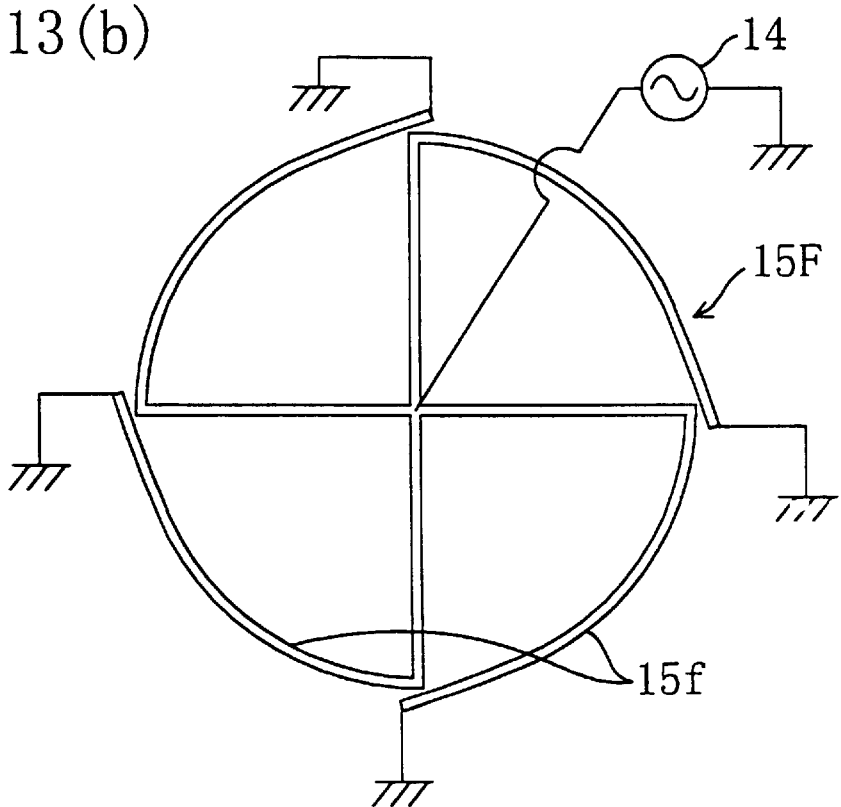

FIGS. 13(a) and 13(b) schematically show the structure of an RF power applying apparatus according to an eighth embodiment of the present invention.

The RF power applying apparatus according to the eighth embodiment comprises: a multiple spiral coil 15F composed of four coil elements 15f connected in parallel; the first RF power source 14 for applying RF power to the central portion of the multiple spiral coil 15F; and an impedance matching circuit (not shown). Each of the four coil elements 15f composing the multiple spiral coil 15F extends linearly outwardly from the central portion of the multiple spiral coil 15F and then extends along ¼ of the circumference of a circle to form a circular arc positioned on the circumference of the circle.

In the multiple spiral coil 15F shown in FIG. 13(a), each of the coil elements 15f composing the multiple spiral coil 15F has a length which is approximately ¼ of the wavelength of the RF power generated from the first RF power source 14, while a slight clearance is maintained between the adjacent circular arcs of the respective coil elements 15f. In the multiple spiral coil 15F shown in FIG. 13(b), each of the coil elements 15f composing the multiple spiral coil 15F has a length which is approximately an integral multiple of ¼ of the wavelength of the RF power generated from the first RF power source 14, while the adjacent circular arcs are electrically insulated from each other though they are apparently overlapping when viewed radially. With the structure in which the four coil elements 15f are connected in parallel, the length of the coil element can be reduced significantly, similarly to the multiple spiral coil 15A described above.

Ninth Embodiment

Figure 14:
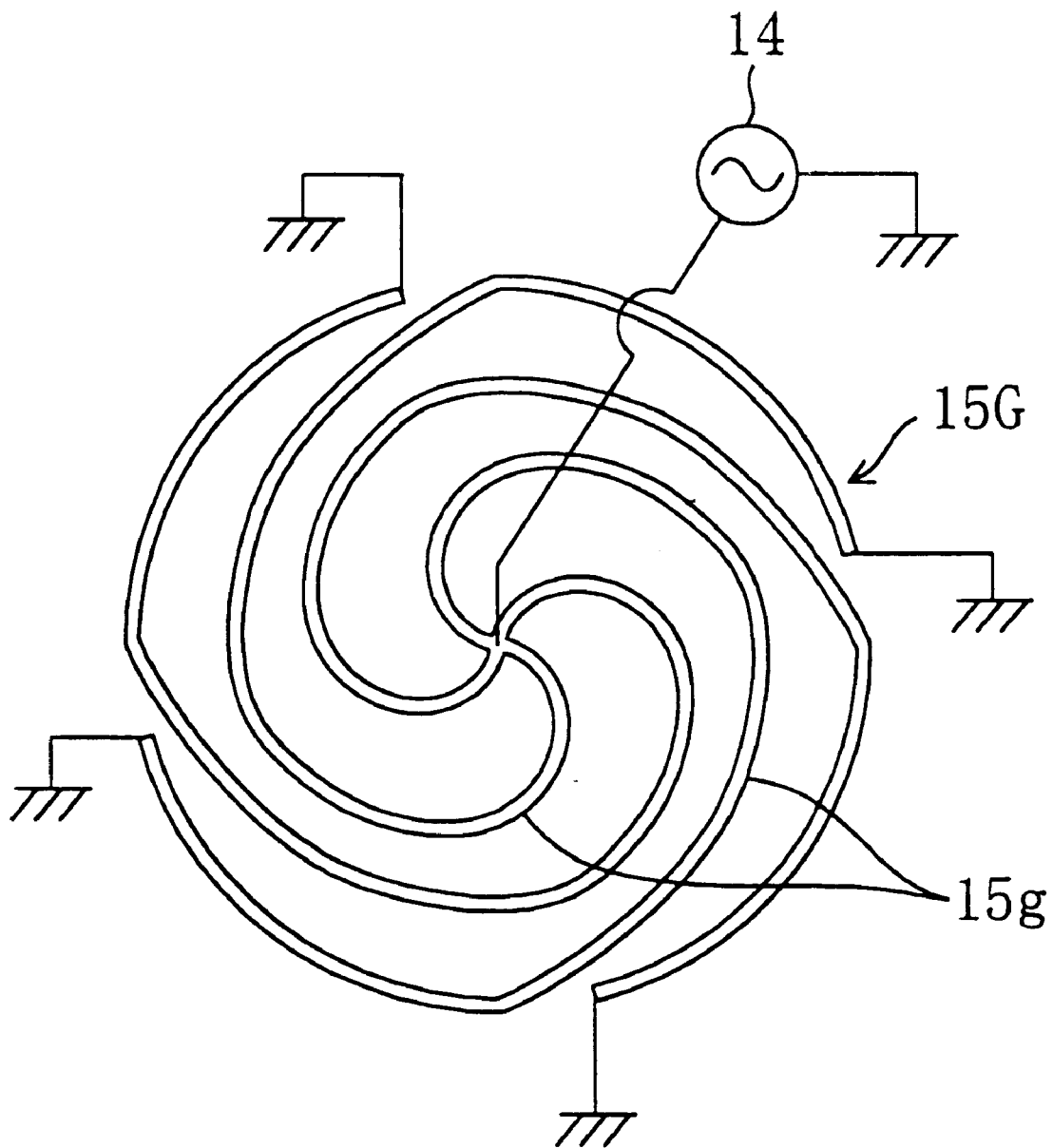
FIG. 14 is a schematic view showing the structure of an RF power applying apparatus according to a ninth embodiment of the present invention.

FIG. 14 schematically shows the structure of an RF power applying apparatus according to a ninth embodiment of the present invention.

The RF power applying apparatus according to the ninth embodiment comprises: a multiple spiral coil 15G composed of four coil elements 15g connected in parallel; the first RF power source 14 for applying RF power to the central portion of the multiple spiral coil 15G; and an impedance matching circuit (not shown). Each of the four coil elements 15g composing the multiple spiral coil 15G extends in a curve outwardly from the central portion of the multiple spiral coil 15G and then extends along ¼ of the circumference of a circle to form a circular arc positioned on the circumference of the circle. Each of the coil elements 15g composing the multiple spiral coil 15G has a length which is approximately ¼ of the wavelength of the RF power generated from the first RF power source 14. With the arrangement in which the four coil elements 15g are connected in parallel, the length of the coil element can be reduced significantly, similarly to the multiple spiral coil 15A described above.

Tenth Embodiment

Figure 15A:
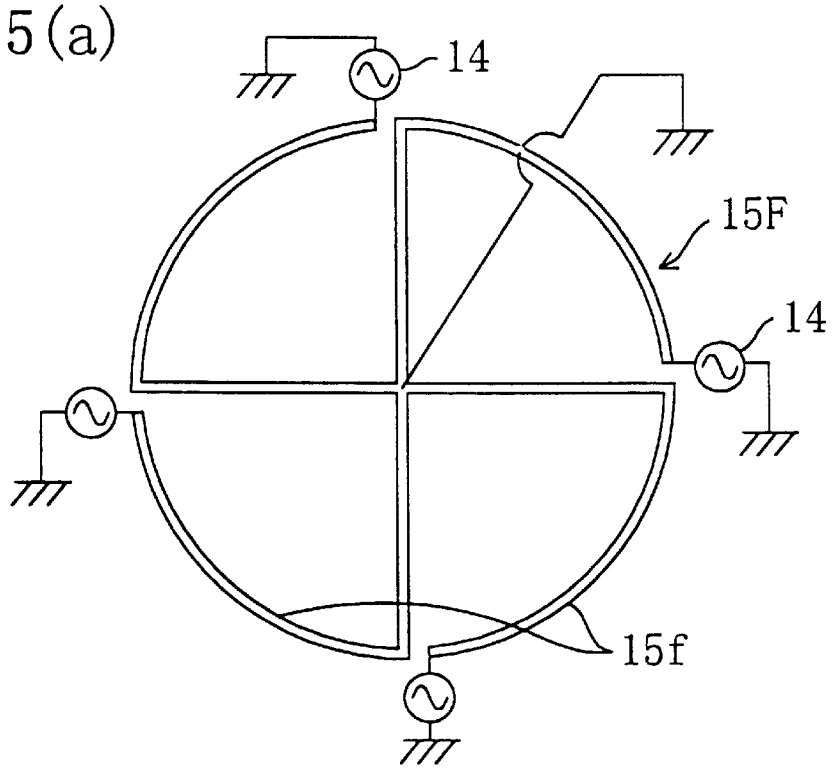
FIGS. 15(a) and 15(b) are schematic views showing the structure of an RF power applying apparatus according to a tenth embodiment of the present invention.
Figure 15B:
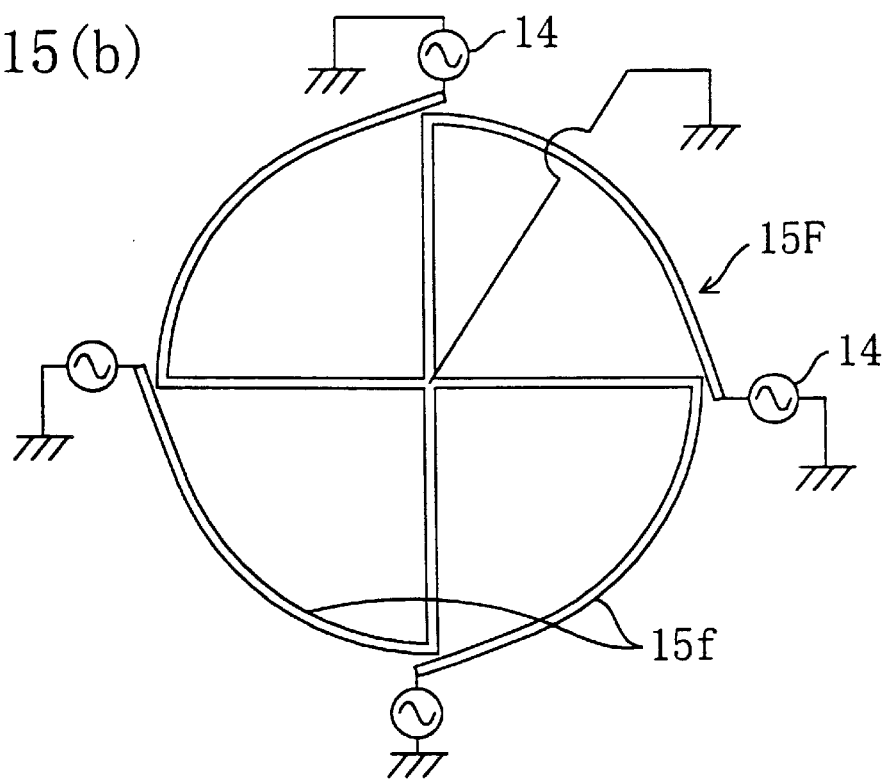

FIGS. 15(a) and 15(b) schematically show the structure of an RF power applying apparatus according to a tenth embodiment of the present invention.

The RF power applying apparatus according to the tenth embodiment has the same configuration as that of the RF power applying apparatus used in the eighth embodiment and comprises: the multiple spiral coil 15F composed of the four coil elements 15f and having its central portion grounded; four first RF power sources 14 for applying RF power to the respective external terminals of the multiple spiral coil 15F; and an impedance matching circuit (not shown). FIG. 15(a) corresponds to FIG. 13(a), while FIG. 15(b) corresponds to FIG. 13(b).

Eleventh Embodiment

Figure 16:
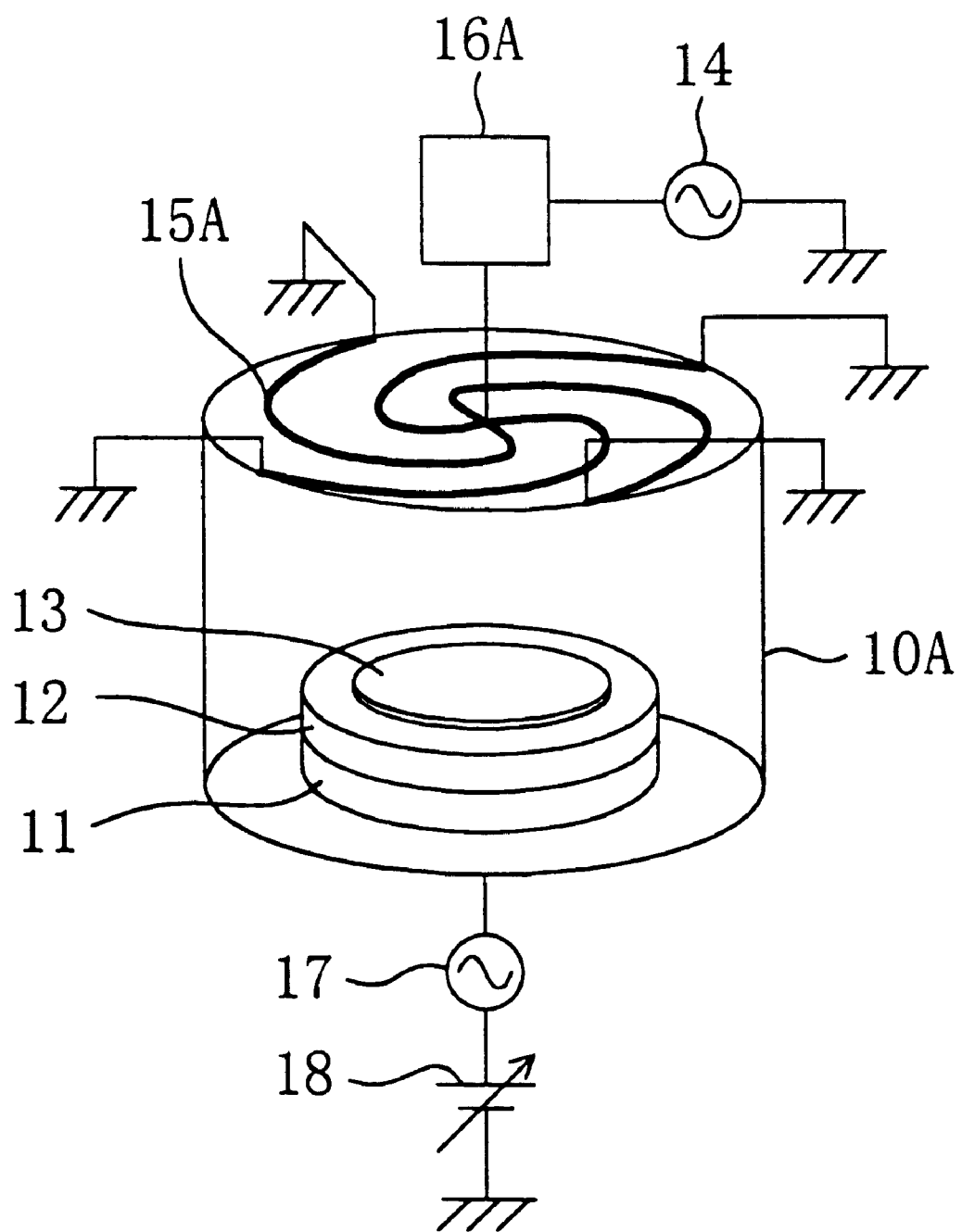
FIG. 16 is a schematic view showing the structure of a plasma processing apparatus according to an eleventh embodiment of the present invention.

FIG. 16 schematically shows the structure of a plasma processing apparatus according to an eleventh embodiment of the present invention. In the eleventh embodiment, the description of like components used in the first embodiment shown in FIG. 1(a) is omitted by providing like reference numerals.

The eleventh embodiment is characterized in that a constant voltage source 18 is connected in series to the second RF power source 17 for applying an RF bias voltage to the lower electrode 12. According to the eleventh embodiment, either one of the RF power and constant voltage or both of the RF power and constant voltage can be applied to the lower electrode 12. Consequently, not only the RF bias voltage but also a dc bias voltage can be controlled, which further facilitates the control of the energy of ions used in plasma processing and enables subtle adjustment and control of the energy of the ions, resulting in increased controllability of the plasma processing.

Twelfth Embodiment

Figure 17:
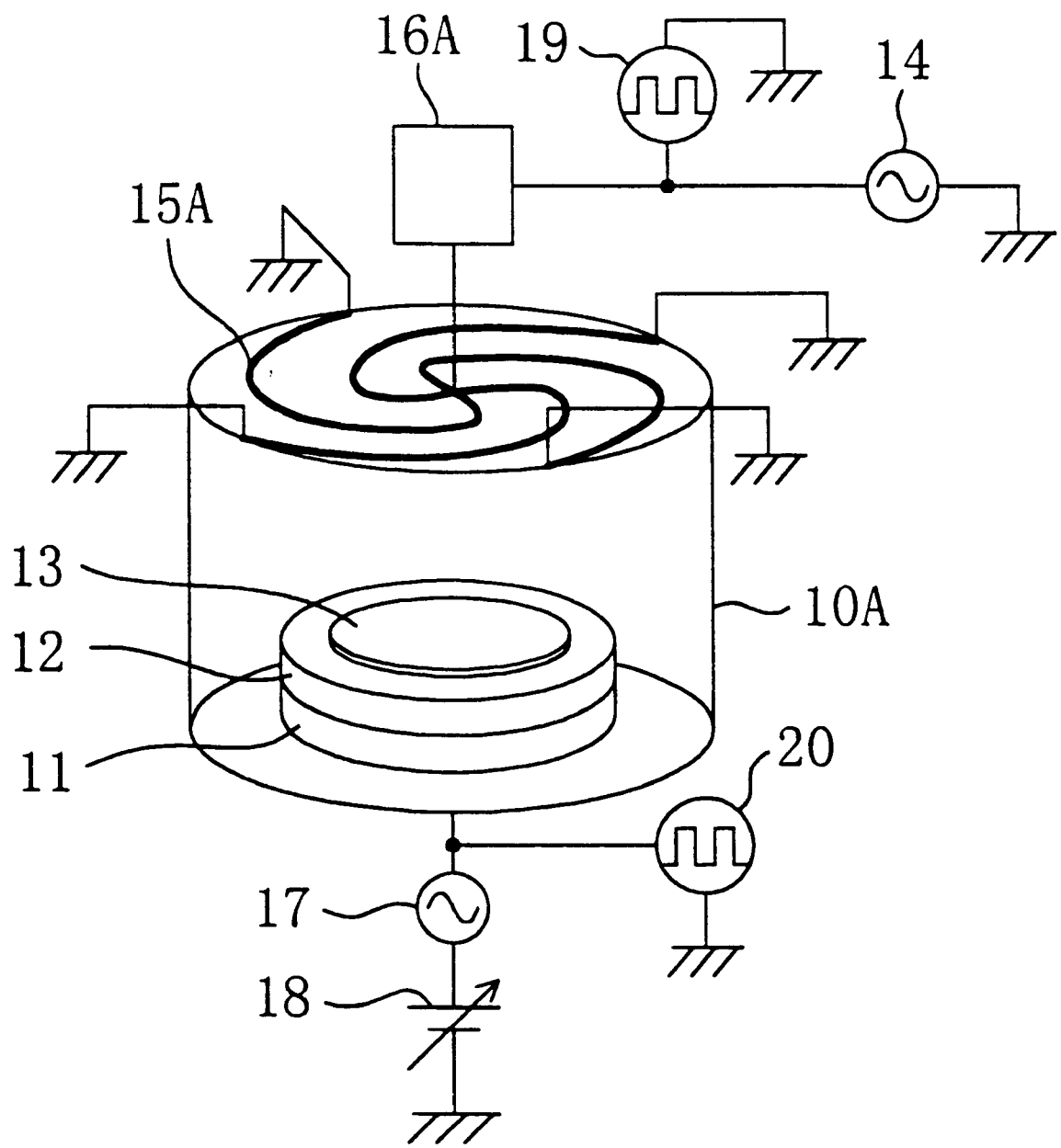
FIG. 17 is a schematic view showing the structure of a plasma processing apparatus according to a twelfth embodiment of the present invention.
Figure 18:
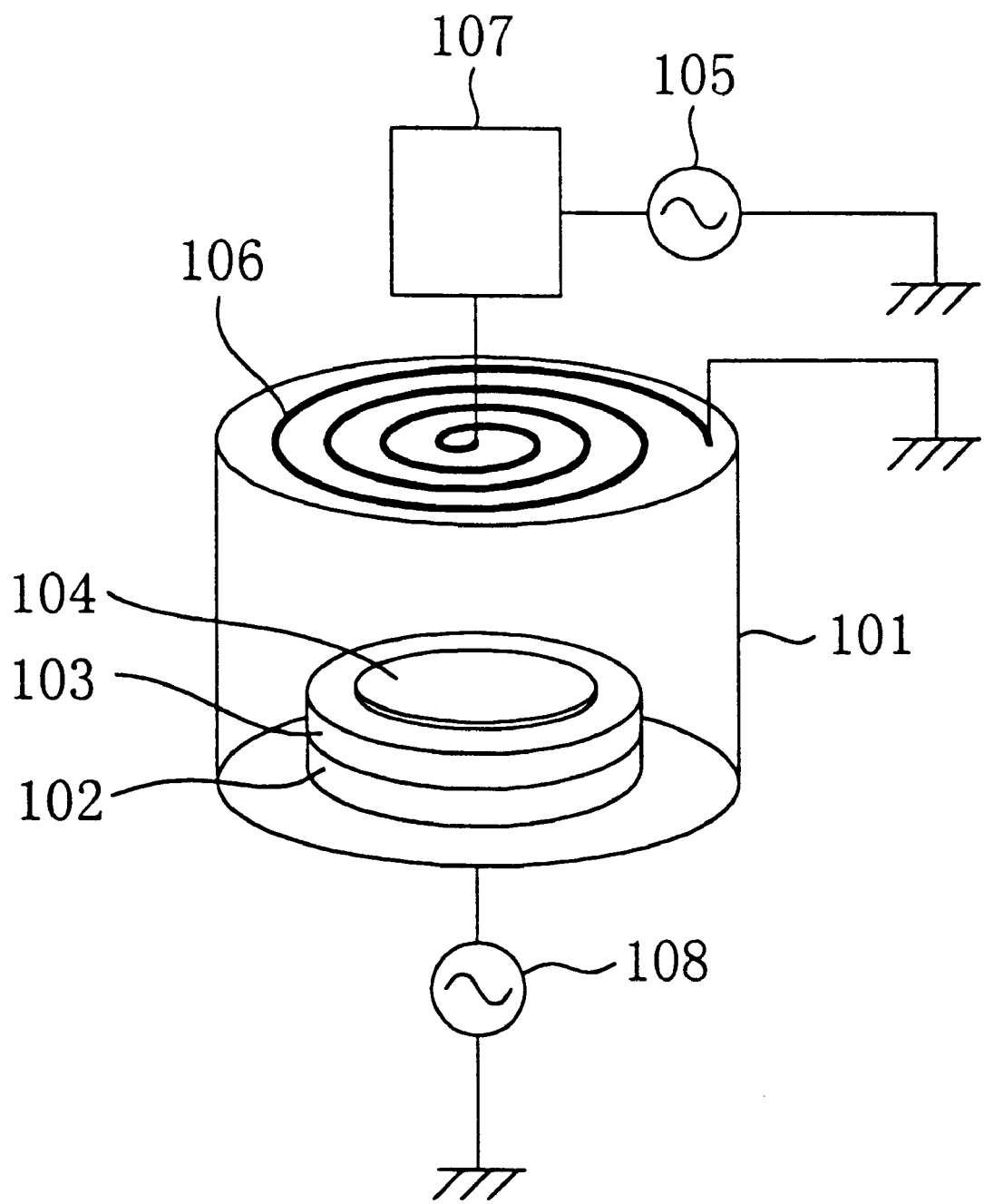
FIG. 18 is a schematic view showing the structure of an inductively-coupled plasma processing apparatus according to a first conventional embodiment.
Figure 19:
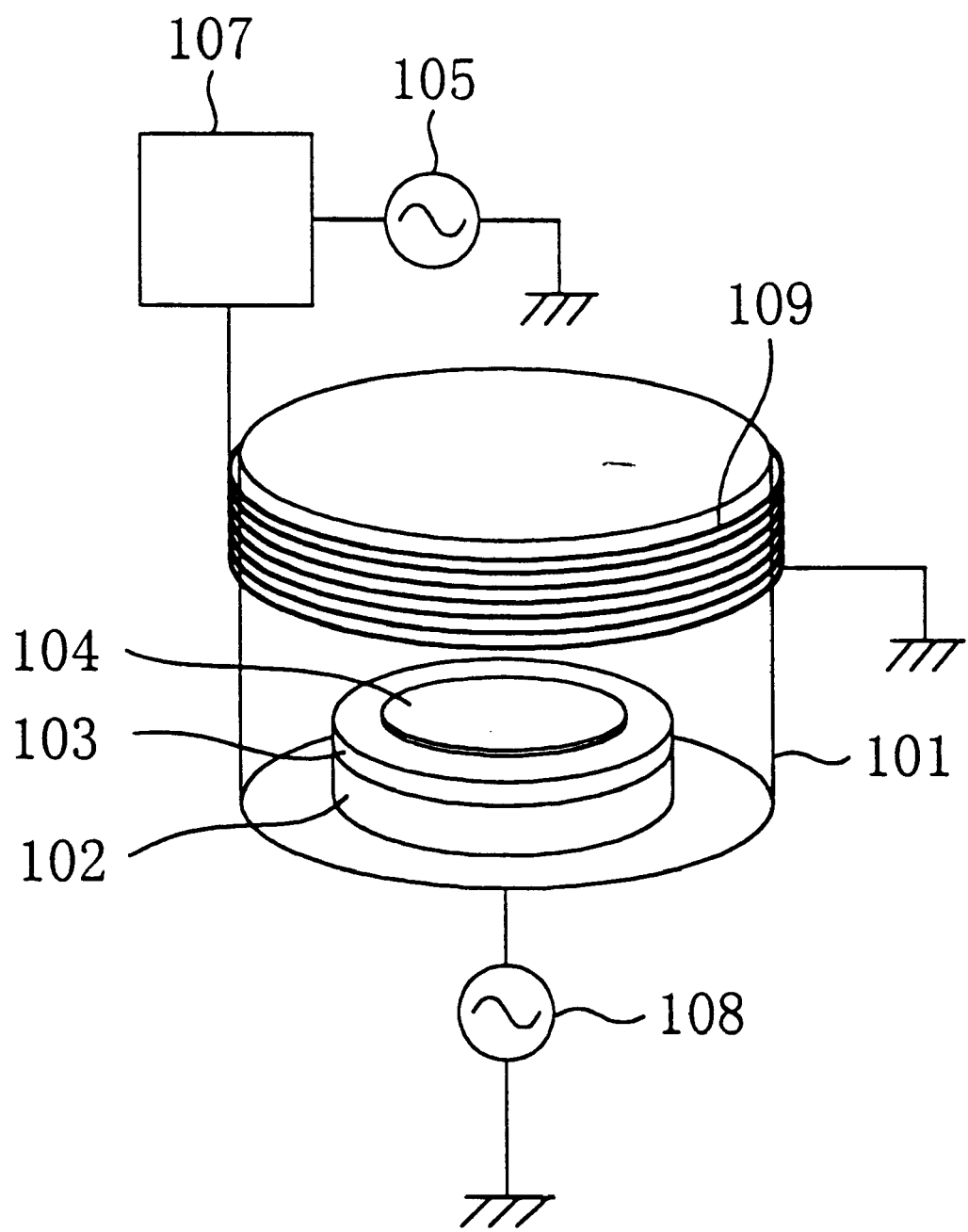
FIG. 19 is a schematic view showing the structure of an inductively-coupled plasma processing apparatus according to a second conventional embodiment.
Figure 20:
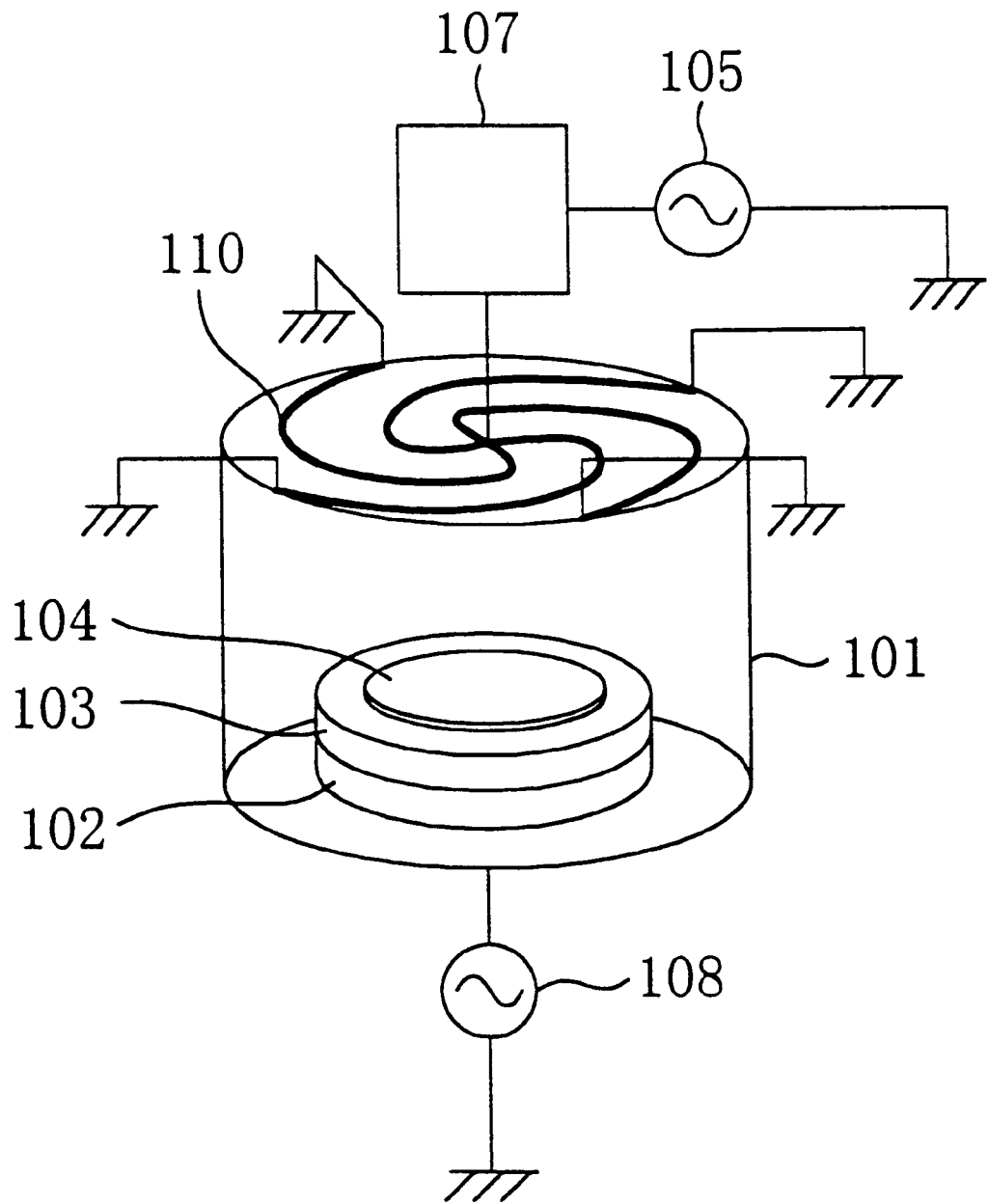
FIG. 20 is a schematic view showing the structure of an inductively-coupled plasma processing apparatus according to a third conventional embodiment.

FIG. 17 schematically shows the structure of a plasma processing apparatus according to a twelfth embodiment of the present invention. In the twelfth embodiment, the description of like components used in the first embodiment shown in FIG. 1(a) is omitted by providing like reference numerals.

The twelfth embodiment is characterized in that the constant voltage source 18 is connected in series to the second RF power source 17 for applying an RF bias voltage to the lower electrode 12, similarly to the eleventh embodiment. In addition, there are provided a first pulse modulator 19 for performing pulse modulation with respect to the RF power applied by the first RF power source 14 and a second pulse modulator 20 for performing pulse modulation with respect to the bias voltage applied by the second RF power source 17.

According to the twelfth embodiment, pulse modulation can be performed with respect to the RF power applied by the first RF power source 14 by means of the first pulse modulator 19, so that the controllability of the state of a plasma such as the controllability of the degree of dissociation of the generated plasma and the controllability of the composition of the plasma (component ratio of a radial species to an ion species) is remarkably improved.

Moreover, since the second pulse modulator 20 can perform pulse modulation with respect to either one of the RF power applied by the second RF power source 17 and constant voltage or to both of the RF power and constant voltage, it becomes possible to perform plasma processing by applying, to the lower electrode 12, either one of the RF bias voltage and dc bias voltage each through pulse modulation or both of the RF bias voltage and dc bias voltage each through pulse modulation. Consequently, the controllability of the energy of ions directed to the object 13 to be processed is remarkably improved.

In the case of operating both of the first and second pulse modulators 19 and 20, the degree of dissociation of the plasma and the composition of the plasma can be controlled by means of the first pulse modulator 19, while the direction of the energy of ions or positive/negative ion species to the object 13 to be processed can be controlled by means of the second pulse modulator 20, which enables plasma processing in which radicals and ions are controlled qualitatively and quantitatively.

In the case of using both of the first and second pulse modulators 19 and 20, if the frequencies for pulse modulation of the respective pulse modulators are synchronized, plasma processing with high controllability can be performed.

In the first to twelfth embodiments, a constant voltage source may be connected in series to the first RF power source 14 depending on the type of plasma processing to be performed, thereby applying a dc voltage to each of the coils 15A to 15G.

In the first to twelfth embodiments, if a highly conductive metal such as copper is used as a material composing the coils 15A to 15G, coils can be fabricated at lower cost.

Although the material composing the coils 15A to 15G may be configured as any one of a slab, rod, and tube, the resulting coil is preferably provided with a larger surface area. In the case of forming a coil from the material configured as a slab, the slab may have a smaller or larger side opposed to the chamber. In the case of forming a coil such that the larger side of the slab is opposed to the chamber, the capacitive coupling between the internal space of the chamber and the coil can be adjusted by changing the size of the larger side of the slab, thereby controlling a relative relationship between inductive coupling and capacitive coupling.

As the material composing the wall of the chamber, a dielectric material (insulator) should be used to permit the propagation of a magnetic field generated around the coil through the chamber. Specifically, a material such as quartz ($SiO_2$) or ceramic is preferred.

We claim:

1. An apparatus for performing an inductively-coupled plasma process, said apparatus comprising:

a chamber;

means for keeping an inside of said chamber vacuous;

a sample stage provided in said chamber to support an object to be processed;

gas introducing means for introducing gas into said chamber;

a radio-frequency power source for generating radio-frequency power;

a coil having a length which is approximately an integral multiple of ¼ of a wavelength of said radio-frequency power, said coil generating a magnetic field for changing the gas introduced into said chamber into a plasma when the radio-frequency power from said radio-frequency power source is supplied thereto and a radio-frequency current flows therethrough, said coil having one end connected to said radio-frequency power source via an impedance matcher and the other end grounded, wherein said object comprises a semiconductor substrate, said object being processed using said gas changed into said plasma by said magnetic field.

2. An apparatus for performing an inductively-coupled plasma process according to claim 1, further comprising voltage applying means for applying, to said sample stage, at least one of a radio-frequency voltage and a constant voltage which are electrically insulated from said chamber.

3. An apparatus for performing an inductively-coupled plasma process according to claim 2, further comprising:

a first pulse modulator for performing pulse modulation with respect to the radio-frequency power generated from said radio-frequency power source; and a second pulse modulator for performing pulse modulation with respect to the voltage applied by said voltage applying means.

4. A method of performing an inductively-coupled plasma process, said method comprising the steps of:

placing an object to be processed on a sample stage provided in a chamber having an inside held under vacuum;

introducing gas into said chamber;

applying radio-frequency power generated from a radio-frequency power source to a coil having a length which is approximately an integral multiple of ¼ of a wavelength of said radio-frequency power, said coil having one end connected to said radio-frequency power source via an impedance matcher and the other end grounded;

generating a magnetic field around said coil with a radio-frequency current flowing through said coil;

changing the gas introduced into said chamber into a plasma with the magnetic field generated around said coil; and processing the object to be processed placed on said sample stage with the gas changed into the plasma.

5. A method of performing an inductively-coupled plasma process according to claim 4, further comprising the step of:

applying, to said sample stage, at least one of a radio-frequency voltage and a constant voltage which are electrically insulated from said chamber.

6. A method of performing an inductively-coupled plasma process according to claim 5, further comprising the steps of:

performing pulse modulation with respect to the radio-frequency power applied to said coil; and performing pulse modulation with respect to the voltage applied to said sample stage.

* * * * *

UNITED STATES PATENT AND TRADEMARK OFFICE
CERTIFICATE OF CORRECTION

PATENT NO. : 6,030,667
DATED : February 29, 2000
INVENTOR(S) : Nakagawa et al.

It is certified that error appears in the above-identified patent and that said Letters Patent is hereby corrected as shown below:

On the Cover Page:

In the "Filed" section, change "24" to --23--.

In the Foreign Application Priority Data section; change "1997" to --1996--.

Signed and Sealed this

Twenty-fourth Day of April, 2001

Attest:

NICHOLAS P. GODICI

Attesting Officer    Acting Director of the United States Patent and Trademark Office